(12) United States Patent
Nishioka et al.

(10) Patent No.: US 7,717,589 B2
(45) Date of Patent: May 18, 2010

(54) LIGHT EMITTING DEVICE USING LIGHT EMITTING DIODE CHIP

(75) Inventors: Kouji Nishioka, Kadoma (JP); Masaru Sugimoto, Osaka (JP); Hideyoshi Kimura, Hirakata (JP); Ryoji Yokotani, Hirakata (JP); Yutaka Iwahori, Ibaraki (JP); Takuma Hashmoto, Yawata (JP); Shinya Ishizaki, Hirakata (JP); Satoshi Mori, Osaka (JP); Hiroyuki Sekii, Kadoma (JP); Eiji Shiohama, Katano (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 592 days.

(21) Appl. No.: 10/596,019

(22) PCT Filed: Nov. 25, 2004

(86) PCT No.: PCT/JP2004/017509
§ 371 (c)(1),
(2), (4) Date: May 25, 2006

(87) PCT Pub. No.: WO2005/053041
PCT Pub. Date: Jun. 9, 2005

(65) Prior Publication Data
US 2007/0085103 A1    Apr. 19, 2007

(30) Foreign Application Priority Data

Nov. 25, 2003  (JP)  ............... 2003-394230
Nov. 25, 2003  (JP)  ............... 2003-394532
Nov. 28, 2003  (JP)  ............... 2003-400074

(51) Int. Cl.
*F21V 9/00* (2006.01)
*F21V 9/16* (2006.01)
*H01J 1/62* (2006.01)

(52) U.S. Cl. .................. 362/293; 362/84; 362/257; 362/327; 362/334; 362/335; 362/230; 362/231; 362/800; 257/98; 257/99; 257/100; 313/512

(58) Field of Classification Search .................. 362/84, 362/257, 293, 327, 334, 335, 230, 231, 800; 313/512; 257/98–100
See application file for complete search history.

(56) References Cited

U.S. PATENT DOCUMENTS 6,220,722 B1   4/2001   Begemann
(Continued)

FOREIGN PATENT DOCUMENTS

JP        63-164481        7/1988
(Continued)

OTHER PUBLICATIONS

English Language Abstract of JP 2001-345482.
(Continued)

*Primary Examiner*—Sandra L O'Shea
*Assistant Examiner*—Sean P Gramling
(74) *Attorney, Agent, or Firm*—Greenblum & Bernstein, P.L.C.

(57) ABSTRACT

A light emitting device comprises: an LED chip mounted in a recess formed in a mounting substrate; a wavelength converting member that is disposed so as to cover the recess and the edge area around the recess and that is excited by light emitted from the LED chip to emit light of a wavelength different from an excitation wavelength; and an emission control member disposed at a light output side of the wavelength converting member so as to allow emission of light coming from an area of the wavelength converting member that corresponds to the recess and to prevent emission of light coming from an area of the wavelength converting member that corresponds to the edge area around the recess. This can prevent variations in color between light emitted from the central part of the wavelength converting member and light emitted from the part of the wavelength converting member that is located on the edge area around the recess of the mounting substrate, thereby reducing unevenness of color on the irradiation surface.

18 Claims, 15 Drawing Sheets

U.S. PATENT DOCUMENTS

| | | |
|---|---|---|
| 6,296,376 B1 | 10/2001 | Kondo et al. |
| 6,504,301 B1 * | 1/2003 | Lowery .................... 313/512 |
| 6,517,213 B1 * | 2/2003 | Fujita et al. .................. 362/84 |
| 6,653,651 B1 | 11/2003 | Meinhart et al. |
| 6,874,910 B2 | 4/2005 | Sugimoto et al. |
| 2004/0012958 A1 | 1/2004 | Hashimoto et al. |
| 2004/0036081 A1 | 2/2004 | Okazaki |
| 2004/0135504 A1 | 7/2004 | Tamaki et al. |
| 2004/0190304 A1 | 9/2004 | Sugimoto et al. |
| 2005/0280014 A1 * | 12/2005 | Park et al. .................... 257/98 |

FOREIGN PATENT DOCUMENTS

| | | |
|---|---|---|
| JP | 4-225677 | 8/1992 |
| JP | 6-38268 | 5/1994 |
| JP | 8-107235 | 4/1996 |
| JP | 8-262537 | 10/1996 |
| JP | 2000-58925 | 2/2000 |
| JP | 2001-345482 | 12/2001 |
| JP | 2002-151743 | 5/2002 |
| JP | 2002-185046 | 6/2002 |
| JP | 2002-525814 | 8/2002 |
| JP | 2003-46133 | 2/2003 |
| JP | 2003-46134 | 2/2003 |
| JP | 2003-234511 | 8/2003 |
| JP | 2003-243724 | 8/2003 |
| JP | 2003-281909 | 10/2003 |
| JP | 2003-318448 | 11/2003 |
| JP | 2003-321675 | 11/2003 |
| WO | 00/17569 | 3/2000 |

OTHER PUBLICATIONS

English Language Abstract of JP 2000-58925.
English Language Abstract of JP 2003-318448.
English Language Abstract of JP2002-151743.
English Language Abstract of JP2003-046134.
English Language Abstract of JP2003-243724.
English Language Abstract of JP 2003-234511.
English Language Abstract of JP2003-046133.
English Language Abstract of JP 2002-185046.
English Language Abstract of JP 2003-321675.
English language Abstract of JP 2002-525814, Aug. 13, 2002.
English language Abstract of JP 8-107235, Apr. 23, 1996.
English language Abstract of JP 4-225677, Aug. 14, 1992.
English language Abstract of JP 6-38268, May 20, 1994.
English language Abstract of JP 63-164481, Jul. 7, 1988.
English language Abstract of JP 8-262537, Oct. 11, 1996.
English language Abstract of JP 2003-281909, Oct. 3, 2003.

* cited by examiner $(\overline{aa'} \simeq \overline{bb'})$

LIGHT EMITTING DEVICE USING LIGHT EMITTING DIODE CHIP

TECHNICAL FIELD

The present invention relates to a light emitting device that has a light emitting diode (LED) as a light source so as to be used for illumination, indication, or the like.

BACKGROUND ART

In these years, LED chips have been developed that emit blue light or ultraviolet light by a gallium nitride compound semiconductor. By combining such LED chips with various wavelength converting materials such as fluorescent pigment and fluorescent dye, attempts are being made to develop LED light-emitting devices that produce light of while or other color different from the color of light emitted from the chip. The LED light-emitting devices have the advantages of being compact and lightweight, and requiring relatively less power, and are currently in wide use as indication lights, alternatives to small light bulbs, light sources for liquid crystal panels, and so on. A general method for fixing a wavelength converting material in the above LED light-emitting devices is to form a light emitting portion by filling the part where a light emitting element is placed with a resin containing the wavelength converting material. However, the above technique has the problems that the process is complex and further, it is difficult to control the amount of resin dropped. Consequently, wide variations in color and amount of light may occur between resulting light emitting devices.

For reducing the problems, in a light emitting device disclosed in Japanese laid-open patent publication No. 2001-345482 (Patent Document 1) for example, there has been devised a technique of placing a light emitting element within a recess formed in a mounting substrate and disposing a resin portion containing a wavelength converting material which is excited by light emitted from the light emitting element to emit light of a wavelength different from the excitation wavelength, in such a manner that the resin portion covers the recess and the area around the recess on the mounting substrate.

FIG. 24 shows the schematic configuration of the light emitting device disclosed in Patent Document 1. In this light emitting device, an LED chip 1 is mounted on the bottom of a recess 2a formed in a mounting substrate 2. The recess 2a is filled with a light transmissive resin 111 (serving as the light emitting portion) for extraction of light. Further, a film-shaped wavelength convening member 5 or a light transmissive material containing a wavelength converting material such as a phosphor is disposed so as to cover the recess 2a. The mounting substrate 2 is provided with a wiring portion 114 for supplying electric power to the LED. The wiring portion 114 and the LED chip 1 are connected to each other via a bonding wire 112. In the above described light emitting device, since the wavelength converting member 5 containing the wavelength converting material is made as an independent member, it can be adjusted in size thereof and in density of the wavelength converting material or light absorber. Consequently, the process can be simple, and color variations and light output variations can be reduced between the light emitting devices.

However, as a result of detailed studies of light emitting devices having the above described structure, the inventors of this application have found that there is a problem in the case where such a light emitting device is one using the principle that visible light emitted from the LED chip 1 is converted by the wavelength converting member 5 into visible light within a wavelength hand different from that of the light emitted from the LED chip so that the visible light emitted from the LED chip 1 is mixed with the visible light produced by the wavelength converting member 5. It has been found that, in such a case, considerable difference in color (unevenness of color) may occur between light emitted through the central area of the wavelength converting member 5 and light emitted through the outer edge area of the member that is around the recess 2a of the mounting substrate 2.

A major possible cause of the above problem is that light emitted from the LED chip 1 cannot directly enter the edge area of the wavelength converting member 5 that is around the recess 2a of the mounting substrate 2 because the light is blocked by the recess 2a.

The cause of the unevenness of color is described in more detail. In the areas of the wavelength converting member 5 other than its edge area, light emitted by the LED chip 1 (primary light) can directly enter the wavelength converting member 5 through the interface between the wavelength converting member 5 and the airspace directly after the emission or after diffuse reflection by the inner wall of the recess 2a in the mounting substrate 2. Generally, light from an LED chip is distributed isotropically rather than locally. Therefore, the intensity of primary light does not vary so much depending on locations within the recess of the mounting substrate. Accordingly, there is also no great variation, depending on locations, in the intensity of the primary light entering the wavelength converting member 5 directly through the interface between the wavelength converting member 5 and the airspace. Emitted through the light output side of the wavelength converting member 5 are primary light that remains without being absorbed by the wavelength converting member and light (secondary light) that is produced by the wavelength converting member and has a wavelength different from that of the primary light. The color of the emitted light depends on a mixture ratio of the primary and secondary lights. Since the intensity of the primary light entering the wavelength converting member 5 through the interface between the wavelength converting member 5 and the airspace does not vary so much depending on locations the mixture ratio does not also vary so much depending on the locations so that light of an almost uniform color can be emitted.

On the other hand, the edge area of the wavelength converting member 5 is located outside the recess of the mounting substrate to be hidden when viewed from the LED chip. Due to the recess, primary light cannot enter the edge area of the wavelength convening member 5 via the interface between the member and the airspace. In this area, primary light that can be radiated to the light output side is only light that is scattered in the wavelength converting member 5 toward the edge area of the member after entering the wavelength converting member 5 through an area inside the recess. Therefore large part of the primary light emitted from the edge area toward the light output side has passed through a light path longer than that of light emitted from other areas in the member and thus has decreased in intensity due to more absorption by the wavelength converting member. As a result light emitted from the light output side of the edge area has secondary light larger in proportion than primary light, so that the mixture ratio is considerably different from that at the central area of the wavelength converting member 5. This may cause the unevenness of color between the central area and the edge area of the wavelength converting member 5.

A possible way for solving the problem except for the means disclosed below, is to eliminate the edge area of the wavelength converting member around the recess 2a by placing the entire wavelength converting member within the recess 2a so that there is no zap between the member and the side wall of the recess. However, in fact, the above way has the problem that the productivity cannot be increased with difficulty in automatic assembling due to dimensional tolerances of the recess 2a and the wavelength converting member and further due to tolerances in placing the wavelength converting member within the recess 2a.

FIG. 25 shows another conventional light emitting device using an LED chip. In the device, a plurality of mounting substrates 2 each having an LED chip 1 are mounted on a wiring board 3, which is disposed in a housing 10 of a lighting apparatus. There is a light control lens 40 disposed for the LED chips 1. The light control lens 40 is held on the housing 10 of the lighting apparatus with a retaining cap 12.

A light emitting device is also known that has a done-shaped lens to provide light from an LED chip with an appropriate emission angle and that is designed to have uniform brightness on the light emitting surface (see Japanese laid-open patent publication No. 2000-58925 (Patent Document 2)). FIG. 26(a) shows a structure relatively similar to the light emitting device disclosed in Patent Document 2. In this structure, a light distribution control member is disposed over a mounting substrate 2 on which a LED chip is mounted. The light distribution control member shown in FIG. 26(a) is a member that combines light collection by a convex lens and light collection by total reflection, and it is called a hybrid lens hereinafter. The hybrid lens 41 is held by a cylindrical holder 60 made of a resin, which is fixed to a wiring board 3 with an adhesive 7. The holder 60 has a diameter substantially equal to the outline of the light control lens 41 and holds the lens 41 with a protrusion 41b, which is formed at the peripheral edge of the upper side of the lens 41, received in a groove 60a at the upper end of the holder 60. At the central region of the bottom, the holder 60 has a hole of substantially the same shape as the outline of the mounting substrate 2. By fitting the package 2 into the hole, the lens 41 and the package 2 are positioned and fixed. The lens 41 has the light emitting portion of the LED located adjacent to the focal point thereof so that the optical axis of the lens coincides with the optical axis of the LED (see Lumileds Luxeon Star/0).

In the above structure large pail of light emitted from the LED chip 1 enters the light control lens 41. Part of the light enters a downwardly convex portion at the under side of the lens and then enters an upwardly convex portion at the upper side of the lens. The part of the light is refracted at the surfaces of the two portions to exit for narrow angle light distribution. Part of the emitted light enters the lens through the inner wall around the convex portion at the lower side of the lens. The part of the light is refracted at the surface of the wall and then totally reflected by the side face of the lens to be in a narrow angle. Thereafter, the part of the light is further refracted at the top surface of the lens around the convex portion to exit for light distribution similar to that of the light exiting from the convex portion at the upper side of the lens.

However such a light emitting device as disclosed in the above Patent Document 2 has the following problem. A light beam emitted from the device is small as compared to a commonly used lamp. Therefore, the device is usually used white the light condensing is controlled. Further, the light input portion of the hybrid lens is of a size substantially equal to the light emission from the LED. In such an optical system, it is necessary to accurately keep the relative position between the LED and the lens. When the mounting accuracy is lowered (i.e., the optical axes of the two become misaligned or the distance between the two becomes large), the efficiency of entering of light into the hybrid lens is lowered or the exiting light becomes distorted.

With respect to the above, in the case where there is an uneven portion such as a pattern 3P on the wiring board 3 (unit) near the LED element in the above light emitting device, the holder 60 may be inclined as shown in FIG. 26(b). Accordingly, the optical axis A of the LED may be misaligned with respect to the optical axis B of the hybrid lens, thus causing the above described problem. Further, in general, the size of a hybrid lens is significantly larger than the size of the light emitting portion of an LED (for example, the diameter Φ of a lens is 20 mm while the diameter Φ of the light emitting portion of an LED is 5 mm). The holder 60 is of a cylindrical shape substantially identical in size to the lens 41 and has the bottom face closely in contact with the wiring board 3. Therefore, it is impossible to mount an electronic component on the part of the wiring board 3 that is occupied by the holder 60. Accordingly, the wiring board 3 needs to be increased in size so that electronic components can be mounted, which results in increase in size of the light emitting device containing the lens 41 and the holder 60.

FIG. 27 shows another conventional light emitting device having an LED chip or which the side toward a mounting substrate is encapsulated in a resin. The mounting substrate 2 of this light emitting device has a deep recess 2a that can entirely accommodate a light extraction increasing portion 15, which can reduce the difference in refractive index between the LED chip 1 and the airspace and reduce the total reflection at the interface between the portion and the airspace as far as possible. Placed in the recess 2a is an LED chip 1, on which the light extraction increasing portion 15 made of glass or a light transmissive resin such as silicone resin is placed so as to enhance the efficiency of extraction of light emitted from the light output surface of the LED chip 1. The LED chip 1 and the peripheral edge of the light extraction increasing portion 15 are encapsulated in a light transmissive resin 19 such as silicone resin so as to protect the LED chip 1, especially its active layer and electrodes and to fix the light extraction increasing portion 15 (see, for example, Japanese laid-open patent publication No. 2003-318448 (Patent Document 3)).

In the above described conventional device, for encapsulation of the LED chip 1 and the light extraction increasing portion 15, the small amount of sealing resin 19 is dropped into the recess 2a formed in the mounting substrate 2 and cured. There is a difficulty for controlling the amount of sealing resin 19 dropped. Accordingly there is a problem that the height of sealing resin 19 covering the bottom part of the light extraction increasing portion 15 cannot be made uniform, and as a result, variations may occur in the light extraction increasing effects of light extraction increasing portions 15 and then in the light outputs of light emitting devices.

DISCLOSURE OF INVENTION

In view of the above problems, a first object of the present invention is to provide a light emitting device using a wavelength converting member that is excited by light emitted from a light emitting element mounted in a recess formed in a mounting substrate so as to emit light of a wavelength different from the excitation wavelength, wherein light that is emitted from the edge area of the wavelength converting member outside the recess of the mounting substrate and that has a color different from that of light emitted from the central area of the wavelength converting member can be prevented from being directed to the irradiation surface of the device, so that unevenness of color can be reduced on the irradiation surface.

A second object of the present invention is to, in a light emitting device comprising a lens for controlling emission of light coming from a wavelength converting member, reduce the mounting surface area of a wiring board that is occupied by a lens holder so that an electronic component can be disposed adjacent to a mounting substrate, and thus the wiring board can be made compact to reduce the size of the device.

A third object of the present invention is to in light emitting devices comprising a light extraction increasing portion, reduce variations in the effects of the light extraction increasing portions and thus reduce variations in the light outputs or the light emitting devices by setting the height of sealing resin in a recess of a mounting substrate, where an LED chip is mounted, near the upper end of the recess of the mounting substrate.

According to an aspect of the present invention, the above objects are achieved by a light emitting device using an LED chip, comprising: a mounting substrate having a recess and having a wiring portion for supplying electric power to the LED chip; the LED chip mounted on a bottom of the recess; a wavelength converting member that is disposed so as to cover the recess and an edge area around the recess and that is excited by light emitted from the LED chip to emit light of a wavelength different from an excitation wavelength; and an emission control member provided at a light output side of the wavelength converting member so as to allow emission of light coming from an area of the wavelength converting member that corresponds to the recess and to prevent emission of light coming from an area of the wavelength converting member that corresponds to the edge area around the recess. The wavelength converting member can be fluorescent dye, fluorescent pigment, or the like, or it can be a light absorber that absorbs light emitted from an LED chip, for example.

According to the aspect of the present invention, providing the emission control member can prevent radiation of light to the irradiation surface of the device from the part of the wavelength converting member that is located on the edge area around the recess of the mounting substrate. This can prevent variations in color between light emitted from the central part of the wavelength converting member and light emitted from the other part of the member, thereby reducing unevenness of color on the irradiation surface.

The emission control member can be an optical member that is disposed at the light output side of the wavelength converting member and has a light input portion facing the light output side of the wavelength converting member, wherein the light input portion of the optical member has an end of substantially the same shape as the open end of the recess.

The emission control member can be a light blocking frame member disposed on the light output side of the wavelength converting member at a location corresponding to the edge area around the recess, wherein the frame member has an opening of substantially the same shape as the opening of the recess.

The wavelength converting member can be made of a material with high elasticity wherein an outer edge area of the wavelength converting member is compressed by the frame member pressed against the wavelength converting member. This can make it hard for light within the wavelength converting member to be propagated to the area of the member that is located on the area outside the recess. Accordingly, an increased proportion of light produced in the area of the wavelength converting member within the recess can be directed to the irradiation surface, so that the light efficiency can be improved.

The light output side of the wavelength converting member can be convex. This can reduce the difference in the lengths of light paths, through which light emitted from the LED chip is transmitted in the wavelength converting member, based on observation angles. Accordingly, variations in color and intensity of light depending on observation angles can be reduced.

The density of a wavelength converting material in the wavelength converting member can increase toward the center of the wavelength converting member. This can reduce the difference based on observation angles in the ratio of light converted to light of a different wavelength by the wavelength converting material in the wavelength converting member among light emitted from the LED. Accordingly, variations in color and intensity of light depending on observation angles can be reduced.

The light emitting device can further comprise: a wiring board having a wiring portion that is fixed to the mounting substrate so as to supply electric power to the LED chip; and a lens holder for positioning and fixing the lens on the wiring, board, wherein a portion of the lens holder that is fixed to the wiring board is located inside as compared with the outer diameter of the lens. With this configuration, since the portion of the lens holder that is located on the wiring board is small in size, an electronic component can be disposed on the wiring board in the vicinity of the mounting substrate. Accordingly) the wiring board can be made compact.

The light emitting device can further comprise: a light extraction increasing portion provided on a light output side of the LED chip so as to increase efficiency of extraction of light from the LED chip by being combined with the LED chip; and a sealing resin filling the recess in the mounting substrate where the LED chip is mounted so as to seal the recess, wherein a top of the light extraction increasing portion is located higher than a top of a wall of the recess. This can reduce variations in the light outputs of light emitting devices while maintaining high light extraction efficiency by the effects of the light extraction increasing portions.

BEST MODE FOR CARRYING OUT THE INVENTION

First Embodiment

Figure 1:
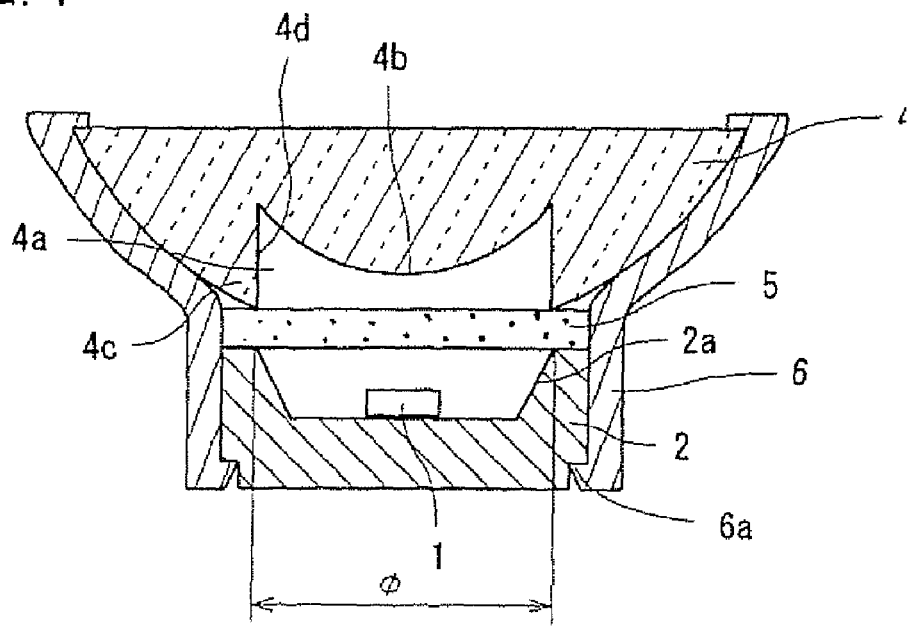
FIG. 1 is a schematic cross sectional view of a light emitting device according to a first embodiment of the present invention.

FIG. 1 shows the schematic configuration of a light emitting device according to a first embodiment. This light emitting device comprises: an LED chip 1: a mounting substrate 2 having a recess 2a in which the LED chip 1 is mounted; a sheet-like wavelength converting member 5 disposed so as to cover the recess 2a and the area around the recess; and a hybrid lens 4 provided at the light output side of the wavelength converting member 5 to function as an emission control member that allows light coming from an area of the wavelength converting member corresponding to the recess 2a to be emitted therefrom. The LED chip 1 is mounted on the bottom of the recess 2a in the mounting substrate 2. The recess 2a has a circular cross section and has a tapered wall. The hybrid lens 4 as the emission control member is provided for preventing uneven color from appearing due to the difference in color between light emitted from the central area of the wavelength converting, member 5 and light emitted from the edge area of the member 5 outside the recess 2a of the mounting substrate 2.

The wavelength converting member 5 is made of a light transmissive material containing a wavelength converting material (in this embodiment, a phosphor that is excited by LED light). This wavelength converting member 5 is formed as a member separate from the LED chip 1 and disposed to cover the recess 2a and the area around the recess. The hybrid lens 4 has a light input portion 4 as which is a concave space circular in cross section and is formed under the lens. The light input portion 4a is defined by a downwardly convex surface 4b and an inner wall 4d of an edge portion 4c surrounding the convex surface 4b. The diameter of the inner wall 4d is substantially the same as the diameter φ of the open end of the recess 2a in the mounting substrate 2. The side of the hybrid lens 4 is held by a holder 6. The holder 6 surrounds the side face of the mounting substrate 2 to be fixed to the mounting substrate 2 with a claw 6a of the holder fitted on the lower part of the mounting substrate 2. A wiring portion for supplying electric power to the LED chip 1 and a bonding wire to the LED chip 1, which are provided on the mounting substrate 2, are not shown in the figure.

In this embodiment, the hybrid lens 4 functions as the emission control member or light blocking member. The hybrid lens has the light distribution control function as described in Background Art, and it is mainly used for the purpose of implementing narrow angle light distribution.

Light enters the hybrid lens through a plane within the tip of the edge portion 4c at the light input portion 4a of the lens. Part of the light that enters the lens through the downwardly convex surface 4b is refracted at the surface and refracted again at the top surface of the lens to exit for narrow angle light distribution. Part of the light that enters the lens through the inner wall 4d is refracted at the wall surface and mostly reflected totally by the side face of the lens to become light for narrow angle light distribution. Thereafter, the light is further refracted at the top surface of the lens and exits from the lens to be distributed in a manner similar to the exiting light that has entered the lens through the downwardly convex surface 4b. As the distance increases between the center of the plane within the tip of the edge portion 4c and the position in the plane through which light enters the lens, the light exiting from the lens has more deviation from a target direction (the light distribution becomes blurred). However, most of the light entering through the above plane is controlled to be distributed substantially in the intended manner.

On the other hand, light entering the lens through an area outside the light input portion 4a escapes through the side face of the lens or, even when exiting through the top surface of the lens, mostly exits in a direction different from the target direction to become so-called stray light. Accordingly, by excluding light having a different color from the light input portion 4a of the lens, the light can be eliminated from target light distribution.

By arranging the light input portion 4a of the lens over the upper surface or light emitting surface of the wavelength converting member 5 except over the edge area of the member that is conspicuous by irregular color, unevenness of color on the irradiation surface of the device can be reduced. As a result, the hybrid lens 4 serves as the emission control member or light blocking member to prevent light of irregular color, which comes from the area of the wavelength converting member 5 located on the edge area around the recess 2a from being directed to the irradiation surface of the device.

This can reduce unevenness of color on the irradiation surface of the device. Further light distribution control by the hybrid lens 4 can be easily achieved.

Second Embodiment

Figure 2A:
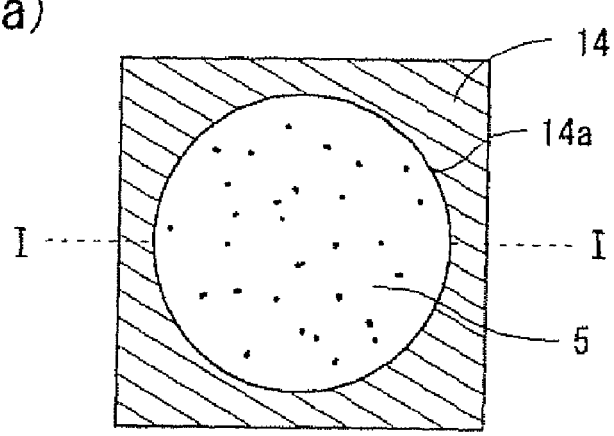
FIG. 2(a) is a plan view of a light emitting device according to a second embodiment of the present invention.
Figure 2B:
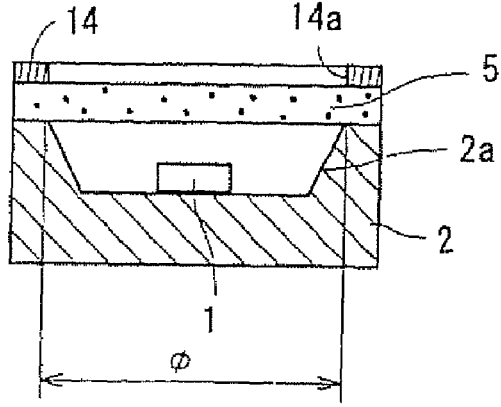
FIG. 2(b) is a cross sectional view taken along a line I-I in FIG. 2(a).

FIGS. 2(a) and 2(b) show the schematic configuration of a light emitting device according to a second embodiment. In place of the optical member as the emission control member used in the above described light emitting device according to the first embodiment, this light emitting device has a frame member 14 made of a light blocking material at the light output side of a wavelength converting member 5. The other components are configured similar to those in the first embodiment. The frame member 14 has an opening 14a corresponding to the recess 2a. The end of the opening 14a has substantially the same shape (diameter φ) as the open end of the recess 2a. This embodiment also achieves an effect equivalent to that of the above embodiment. More particularly, in this embodiment, light emitted from the edge area of the wavelength converting member 5 can be blocked for prevention of unevenness of color.

Third Embodiment

Figure 3:
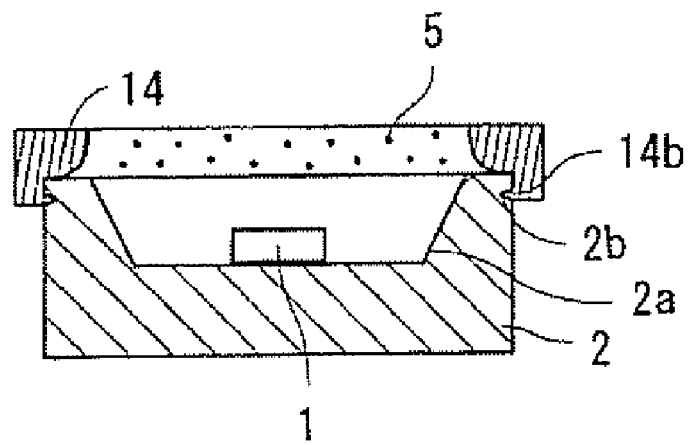
FIG. 3 is a schematic cross sectional view of a light emitting device according to a third embodiment of the present invention.

FIG. 3 shows the schematic configuration of a light emitting device according to a third embodiment. This light emitting device is configured similar to the second embodiment except that it uses a wavelength converting member 5 with high elasticity. More particularly, silicone resin with high elasticity is used as the light transmissive material. A frame member 14 is pressed against the wavelength converting member 5, whereby part of the wavelength converting member 5 that is located on the edge area around the recess 2a is compressed. The frame member 14 pressing the wavelength converting member 5 is fixed to a mounting substrate 2 with a claws 14b, which is formed at the under side of the frame member 14, being engaged in a groove 2b formed in the side face of the mounting substrate 2.

This embodiment not only achieves the above described effect but also makes it hard for light within the wavelength converting member 5 to be propagated to the area of the member 5 that is located on the edge area outside the recess 2a. Accordingly, an increased proportion of light produced in the wavelength converting member 5 within the recess 2a can be directed to the irradiation surface of the device, so that the light efficiency can be improved.

Fourth Embodiment

Figure 4:
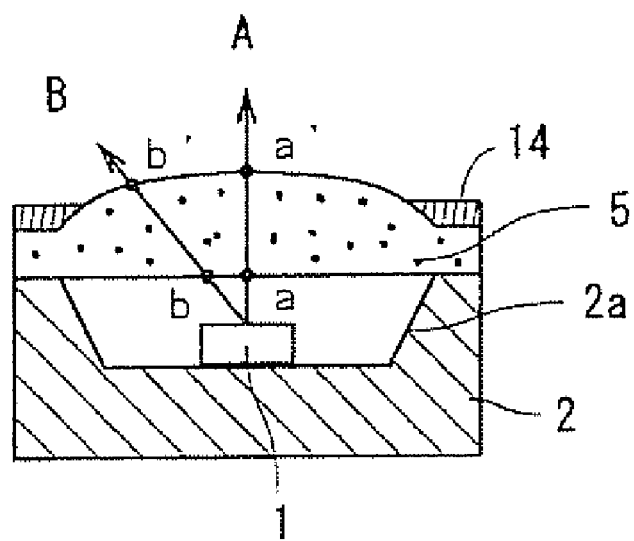
FIG. 4 is a schematic cross sectional view of a light emitting device according to a fourth embodiment of the present invention.

FIG. 4 shows the schematic configuration of a light emitting device according to a fourth embodiment. This light emitting device is configured similar to the second embodiment except that a wavelength converting member 5 has a cross section convex at the light output side. As shown in the figure, the wavelength converting member 5 is configured so that, in two light paths A and B different in observation angle, segments a-a' and b-b' indicating light path lengths in the wavelength converting member 5 are substantially equal in length.

This embodiment can not only achieve the above described effect but also reduce the difference in the lengths of light paths, through which light emitted from an LED chip 1 is transmitted in the wavelength converting member 5, in dependence upon the observation angles. This can reduce the difference depending on observation angles in the ratio of light converted to light of a different wavelength by the wavelength converting member 5. Accordingly, variations in color and intensity of light depending on observation angles can be reduced.

Fifth Embodiment

Figure 5:
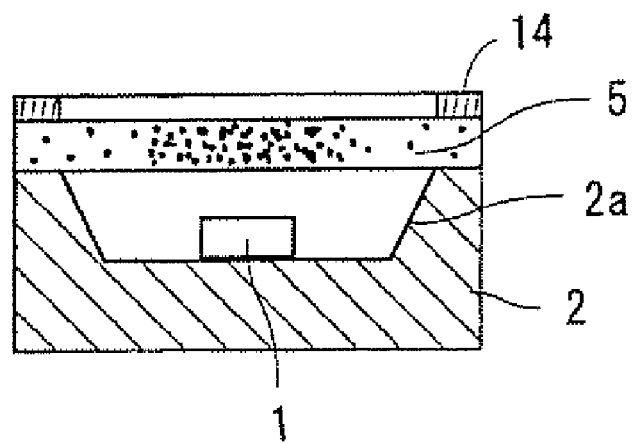
FIG. 5 is a schematic cross sectional view of a light emitting device according to a fifth embodiment of the present invention.

FIG. 5 shows the schematic configuration of a light emitting device according to a fifth embodiment. This light emitting device is configured similar to the second embodiment except that the density of the wavelength converting material contained in a wavelength converting member 5 increases toward the center of the wavelength converting member 5.

Since the density of the wavelength converting material decreases with distance from the center of the wavelength converting member 5 where the light path is short this embodiment has the effect of reducing the difference depending on observation angles in the ratio of light converted to light of a different wavelength by the wavelength converting material, besides the above described effect. Accordingly, variations in color and intensity of light depending on observation angles can be reduced.

Sixth Embodiment

Like the above described embodiments, all the embodiments described below have a structure corresponding to the emission control member so as to provide evenness of color on the irradiation surface of the device.

Figure 6:
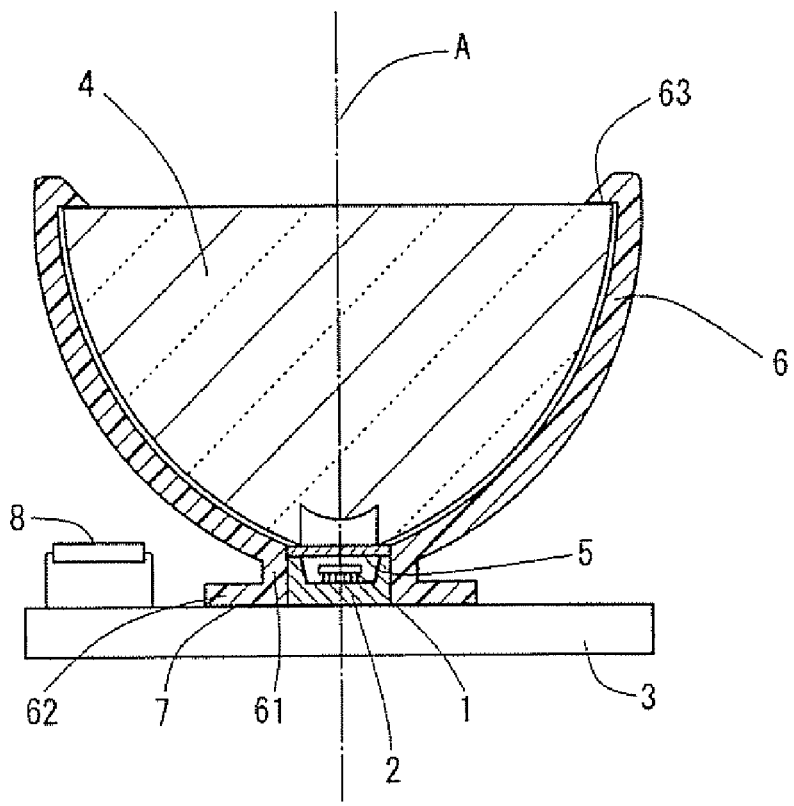
FIG. 6 is a cross sectional view of a light emitting device according to a sixth embodiment or the present invention.

FIG. 6 shows a light emitting device according to a sixth embodiment. The light emitting device has a mounting substrate 2 (corresponding to an LED package) on which an LED chip 1 is mounted; a wiring board 3 that is a unit board having a wiring pattern where the mounting substrate 2 is mounted; a hybrid lens 4 (hereinafter referred to as "lens 4") disposed over the mounting substrate 2 so that the optical axis A substantially coincides with the optical axis of the LED; a wavelength converting member 5; and a lens holder 6 that holds the lens 4 and is fixed to the wiring board 3 and/or the mounting substrate 2. Like the hybrid lens 4 in the first embodiment, the lens 4 is arranged to function as an emission control member and thus prevents emission of light coming from the edge area of the wavelength converting member 5 so as to achieve evenness of color on the irradiation surface of the device.

The lens holder 6 is tapered toward the mounting substrate 2. A portion of the lens holder that is fixed to the wiring board 3 includes a guide portion 61 and a bent portion 62, which are located inside as compared to the outer diameter of the lens. The guide portion 61 is fitted onto the outer surface of the mounting substrate 2. The under surface of the bent portion 62 is joined to the wiring board 3 with an adhesive 7. An electronic component 8 such as, for example, a resistor is mounted on the wiring board 3 in the vicinity of the mounting substrate 2. The wavelength converting member 5 fixed to the mounting substrate 2 to serve as a light emitting portion is located substantially at the focal point of the lens 4. The lens holder 6 is made of a metal such as aluminum, copper or the like, or a resin such as acrylic, polycarbonate or the like. The inner wall of the lens holder 6 has substantially the same shape as the periphery of the lens, so that the cross section of the holder decreases in diameter toward the mounting substrate 2. The lens holder 6 has a protruding claw 63 at the top, which holds the lens 4. The inner wall of the lens holder 6 and the periphery of the lens 4 are just mechanically in contact with each other (point contact at plural locations), so that, for the most part, there is air between the two. Accordingly, the lens holder 6 does not impair the function of the lens 4.

The guide portion 61 at the lower part of the lens holder 6 defines an opening of substantially the same size as the mounting substrate 2 and holds the package therein. The bent portion 62 at the end of the guide portion 61 is formed to be bent outward along the surface of the wiring board 3 so that the lens holder 6 can stand vertically upward on the wiring board 3. The outer diameter of the bent portion 62 is smaller than the outer diameter of the lens 4. The size of the wiring board 3 is substantially equal to the outer diameter of the lens 4.

In this sixth embodiment, the lens 4 is fixed to the lens holder 6 by inserting the lens 4 into the lens holding portion of the lens holder 6 and bending the claw 63 at the top of the lens holder 6. The lens 4 is positioned and fixed with respect to the light emitting portion on the mounting substrate 2 by inserting the guide portion 61 of the lens holder 6 onto the mounting substrate 2 alone the outer surface of the substrate and joining the bent portion 62 to the surface of the wiring board 3 with the adhesive 7. Since the outer diameter of the bent portion 62 of the lens holder 6 is smaller than the outer diameter of the lens 4, it is possible to mount the electronic component 8 such as a resistor or the like on a portion on the wiring board 3 that is under the lens holder 6 and adjacent to the mounting substrate 2.

Since the holding portion of the lens holder 6 is located within the outer diameter of the lens, the wiring board 3 can be made compact, and the portion of the lens holder 6 that is fixed on the wiring board 3 can be made small. Accordingly, the wiring board 3 can have sufficient space for mounting of the electronic component 8. Further, since the lens holder 6 is tapered toward the mounting substrate 2, even a tall component can be mounted. The inner face of the lens holding portion of the lens holder 6 can be a mirror. In such a case an effect similar to the above can be achieved. Besides, light leaking through the side face of the lens 4 without being totally reflected can be reflected by the mirror to enter the lens 4 again. Accordingly the light utilization efficiency can be further improved.

Figure 7:
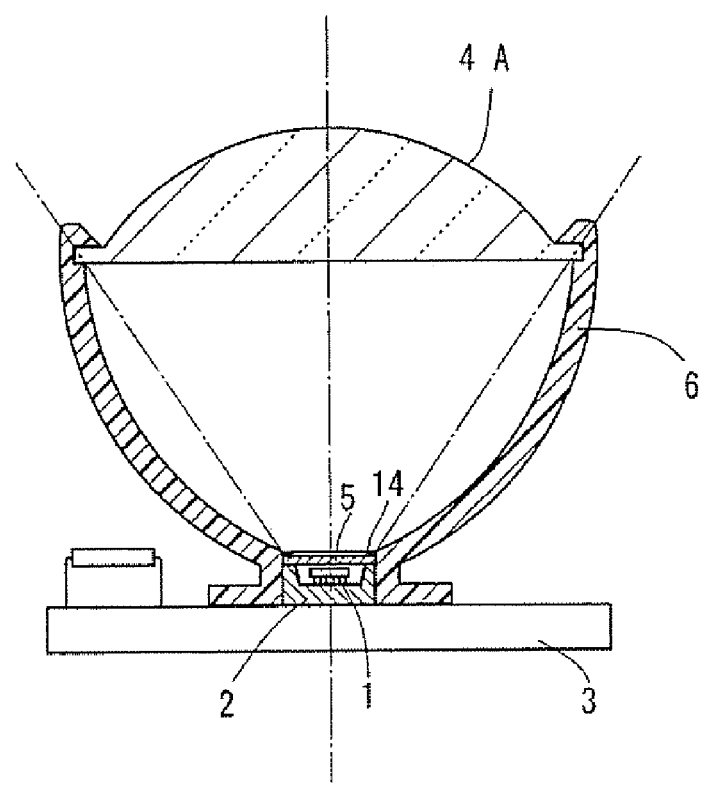
FIG. 7 is a cross sectional view of a light emitting device that is a modified example of the same.

FIG. 7 shows a modified example of the sixth embodiment. In this example, a convex lens 4A is used in place of the above described hybrid lens 4. Further; provided on the upper surface of a wavelength converting member 5 is a light blocking frame member 14, which blocks light emitted from the edge area of the wavelength converting member 5 to prevent unevenness of color (ditto for the cases described below where a convex lens is used). The other components including a lens holder 6 are configured similar to those in the above embodiment, so that this example has an effect equivalent to that of the above embodiment.

Seventh Embodiment

Figure 8:
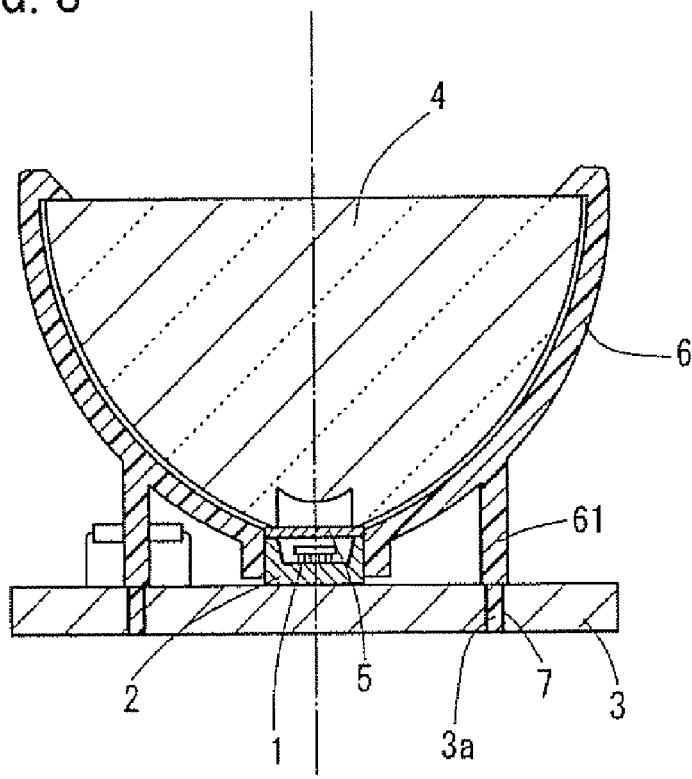
FIG. 8 is a cross sectional view of a light emitting device according to a seventh embodiment of the present invention.

FIG. 8 shows a light emitting device according to a seventh embodiment. Unlike the sixth embodiment, this seventh embodiment does not have the bent portion of a lens holder 6. Instead, in this embodiment, three evenly spaced guide portions 61 to fix the lens holder are formed to protrude from the periphery of the lens holding portion of the lens holder toward a wiring board 3. The wiring board 3 has through holes 3a that is located directly under the guide portions 61 for fixing the lens holder. By inserting the ends of the guide portions 61 into the through holes 3a of the wiring board and joining them with an adhesive, the lens holder 6 is fixed to the wiring board 3. The positioning and fixing of the mounting substrate 2 and the lens 4 on the wiring board 3 is achieved by the lens holder 6 (the same fixing means). This second embodiment can provide improved inclination accuracy of the hybrid lens 4.

Figure 9:
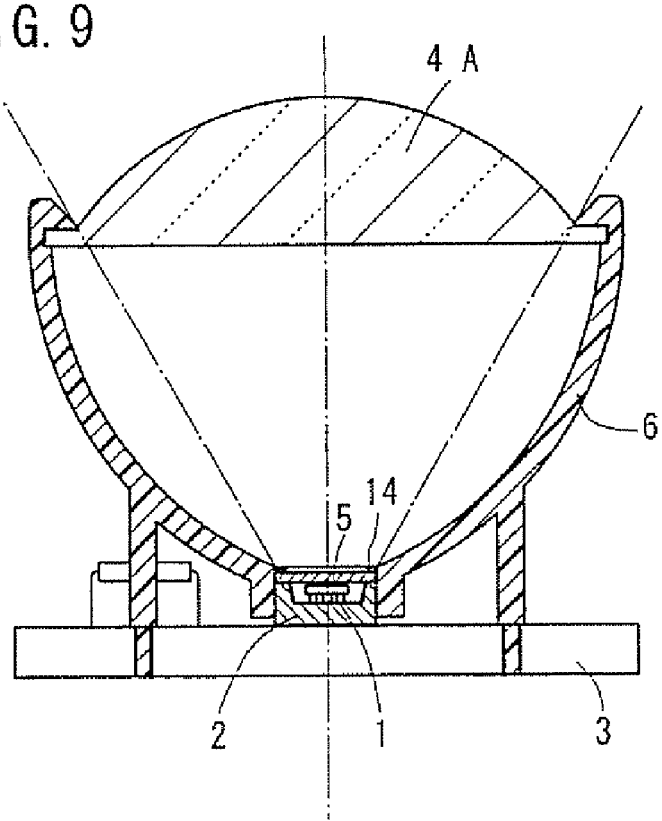
FIG. 9 is a cross sectional view of a light emitting device that is a modified example of the same.

FIG. 9 shows a modified example of the seventh embodiment. In this example, a convex lens 4A is used in place of the above hybrid lens 4. The other components are configured similar to those in FIG. 7, so that this example has an effect equivalent to that of the example shown in FIG. 7.

Eighth Embodiment

Figure 10:
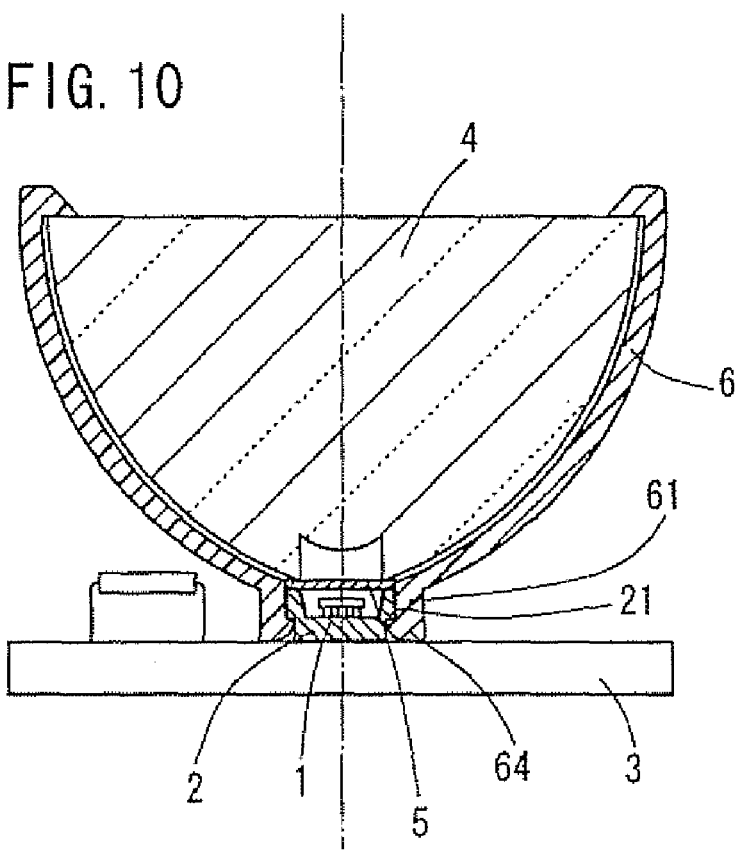
FIG. 10 is a cross sectional view of a light emitting device according to an eighth embodiment of the present invention.

FIG. 10 shows a light emitting device according to an eighth embodiment. This eighth embodiment is different from the seventh embodiment in that the lower pail of the side of a mounting substrate 2 is recessed to form a step 21, and the guide portion 61 of a lens holder 6 has a hook-shaped claw 64 extending inward at the end thereof. In this third embodiment, by pushing the guide portion 61 of the lens holder 6 outward by the width of the claw 64 and inserting it onto the mounting substrate 2 along the side face of the substrate, the lens holder 6 is fixed to the mounting substrate 2 by the claw 64 engaged with the step 21 at the lower part of the mounting substrate 2. In this way, the guide portion 61 of the lens holder 6 is positioned and fixed so as to hold the side face of the mounting substrate 2 therein. In this state, the lower end of the claw 64 is substantially in contact with the upper surface of a wiring board 3.

Since the lens holder 6 is fixed to the mounting substrate 2 in the above manner, the relative position between the hybrid lens 4 and the mounting substrate 9 remains unchanged even when the mounting substrate 2 is mounted in an inclined position. Thus, the positioning accuracy can be further improved. Further, since the guide portion 61 of the lens holder 6 is not fixed to the wiring board 3, the wiring board 3 can have increased space. Accordingly it is possible to make the wiring board 3 more compact. Since no fixing member is required for fixing the lens holder 6, the material cost can be reduced. Beside, since the fixing is easy, the volume efficiency can be improved.

Figure 11:
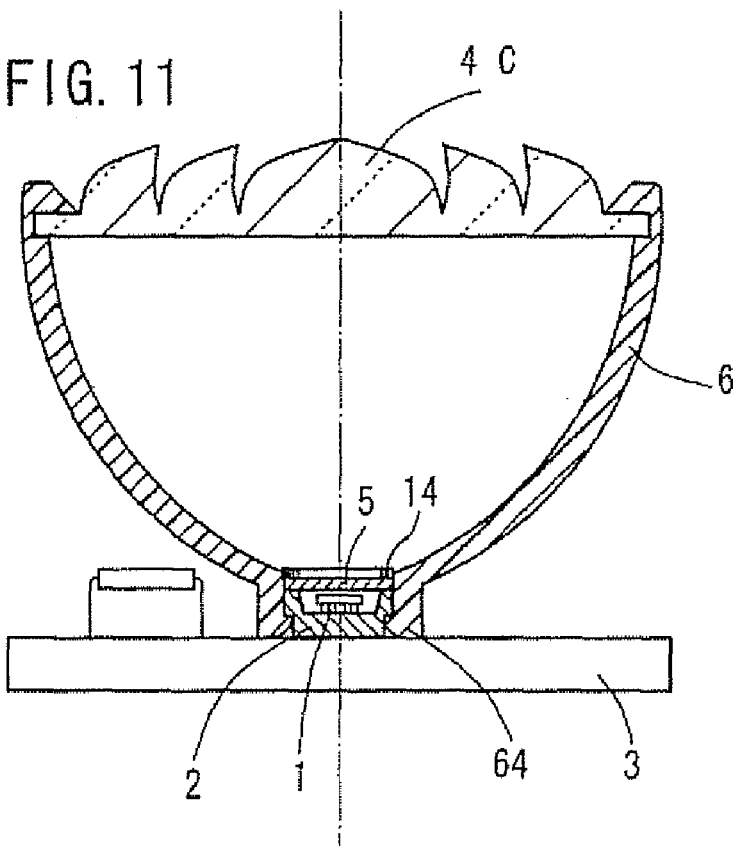
FIG. 11 is a cross sectional view of a light emitting device that is a modified example of the same.

FIG. 11 shows a modified example of the eighth embodiment. In this example, a Fresnel lens 4C is used in place of the above hybrid lens 4. The other components are configured similar to those in FIG. 7, so that this example has an effect equivalent to that of the example shown in FIG. 7.

Ninth Embodiment

Figure 12:
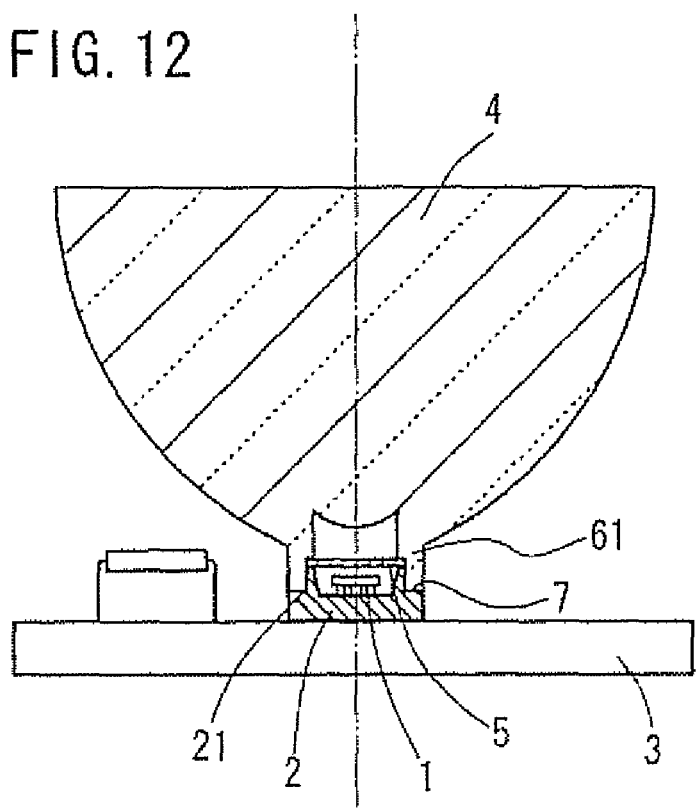
FIG. 12 is a cross sectional view of a light emitting device according to a ninth embodiment of the present invention.

FIG. 12 shows a light emitting device according to a ninth embodiment. This ninth embodiment has a guide portion 61 formed by extending the lower end of a hybrid lens 4. A mounting substrate 2 has a step 21 at the outer edge of the upper side thereof. The guide portion 61 of the hybrid lens 4 is fitted on the step 21 of the mounting substrate 2 and joined to the step with an adhesive 7. In this fourth embodiment, the hybrid lens 4 (especially its guide portion 61) doubles as a lens holder, so that the material cost can be reduced. Further, since the hybrid lens 4 is directly joined to the mounting substrate 2 the positioning accuracy can be further improved.

Figure 13:
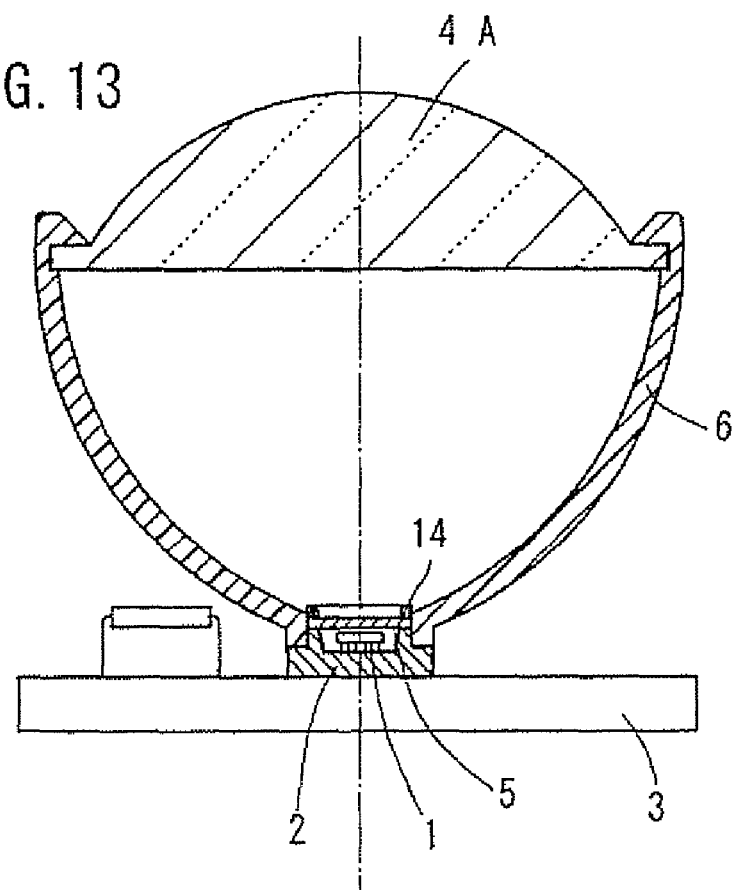
FIG. 13 is a cross sectional view of a light emitting device that is a modified example of the same.

FIG. 13 shows a modified example of the ninth embodiment. In this example, a convex lens 4A is used in place of the above hybrid lens 4 with a lens holder 6 directly fixed to a mounting substrate 2. This example has an effect equivalent to that of the example shown in FIG. 7.

Tenth Embodiment

Figure 14A:
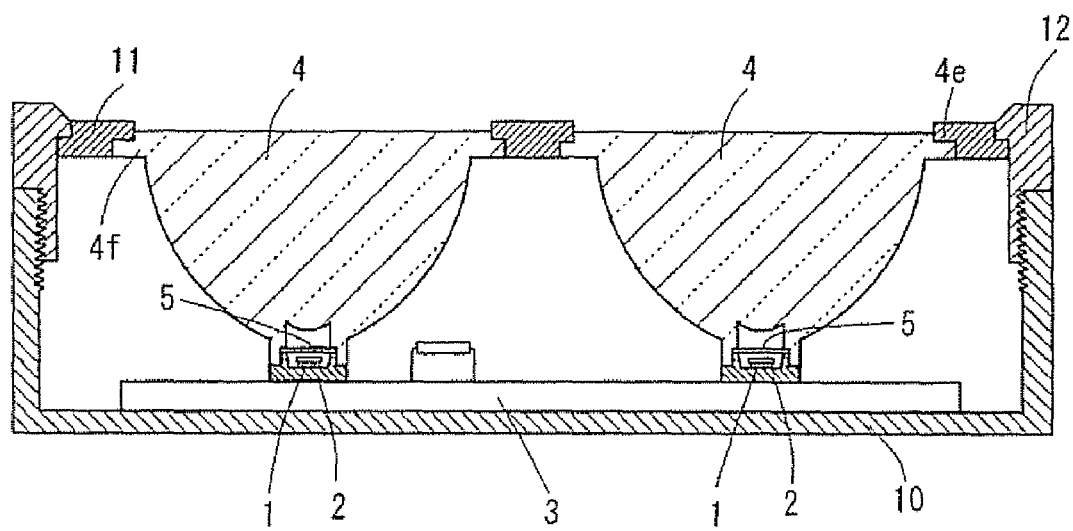
FIG. 14(a) is a cross sectional view of a light emitting device according to a tenth embodiment of the present invention.
Figure 14B:
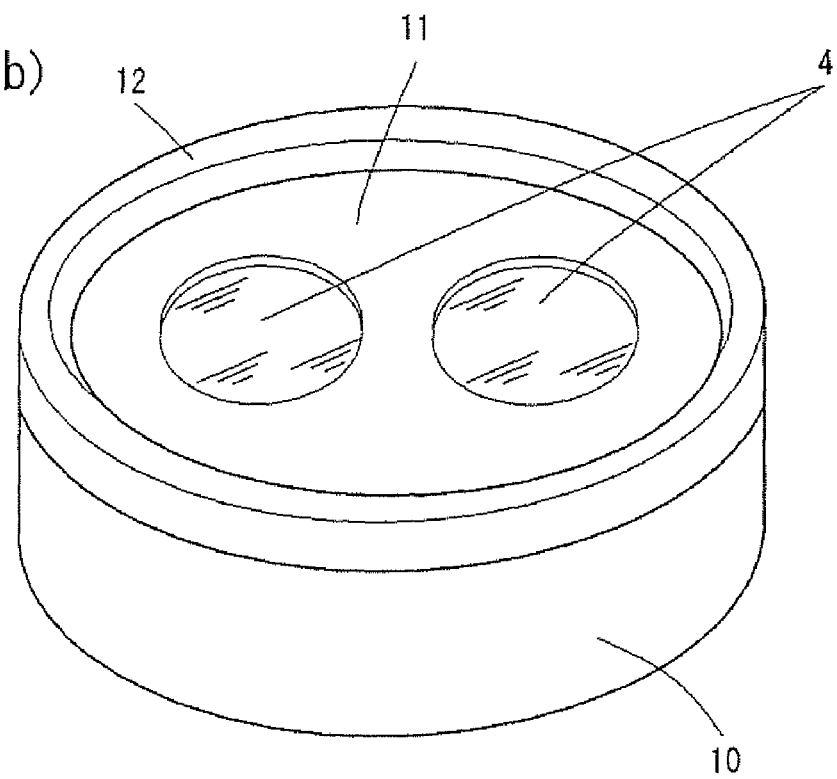
FIG. 14(b) is a perspective view of the same.

FIGS. 14(a) and 14(b) show a light emitting device according to a tenth embodiment. In this tenth embodiment, a plurality of mounting substrates 2 are mounted on a wiring board 3. Each hybrid lens 4 has a guide portion 40 protruding outward at the periphery of the upper side thereof. The guide portion 4f has a step 4e at the upper side. The hybrid lenses 4 are mounted on the respective mounting substrates 2, which are installed in a housing 10 of a lighting apparatus to for the lighting apparatus. The housing 10 has a cover 11 to cover the opening at the top. The cover 11 has holes to expose the top surfaces of the hybrid lenses 4. Around the holes, the cover 11 has steps to fit on the steps 4e of the guide portions 4f of the lenses 4. The cover 11 is secured to the housing 10 by screwing a ring-shaped retaining cap 12 disposed over the cover 11. Provided at the steps around the holes of the cover 11 is a resin with high elasticity.

In this tenth embodiment, the hybrid lenses 4 are fixed on the respective mounting substrates 2 by the cover 11 pressing the lenses against the substrates with sufficient force. In this case, it is unnecessary to join the hybrid lenses 4 to the mounting substrates 2 with an adhesive. Thus, the manufacturing cost can be reduced. Further; the inclination accuracy of the hybrid lenses 4 can be improved.

Figure 15:
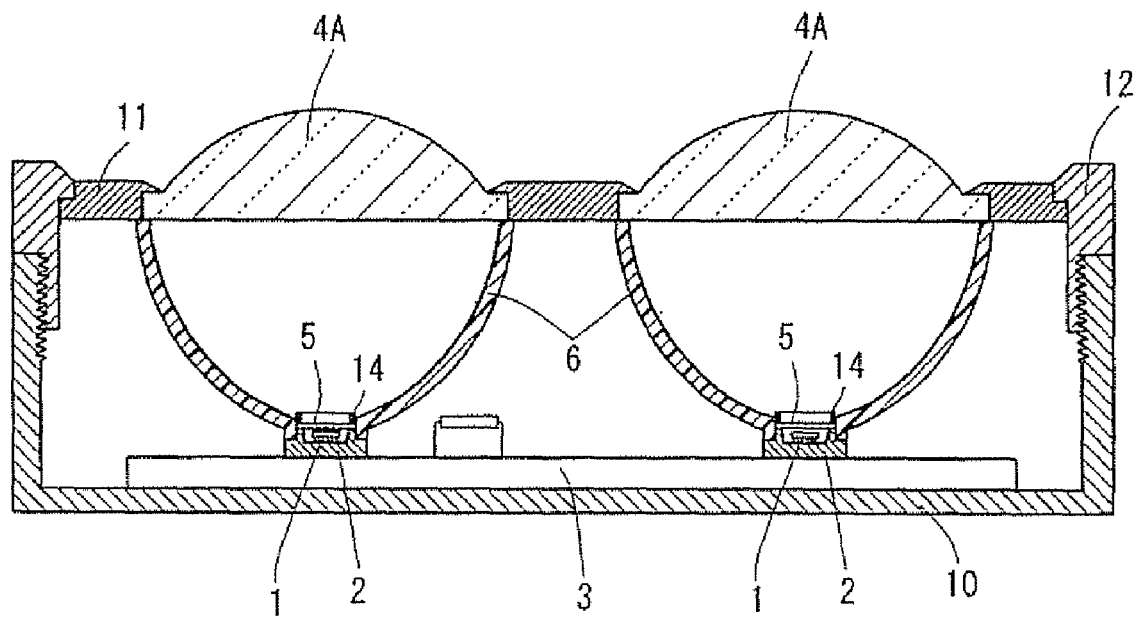
FIG. 15 is a cross sectional view of a light emitting device that is a modified example of the same.

FIG. 15 shows a modified example of the tenth embodiment. In this example, convex lenses 4A are used in place of the above hybrid lenses 4 with lens holders 6 directly fixed to mounting substrates 2. This example has an effect equivalent to that of the example shown in FIG. 7.

Eleventh Embodiment

Figure 16:
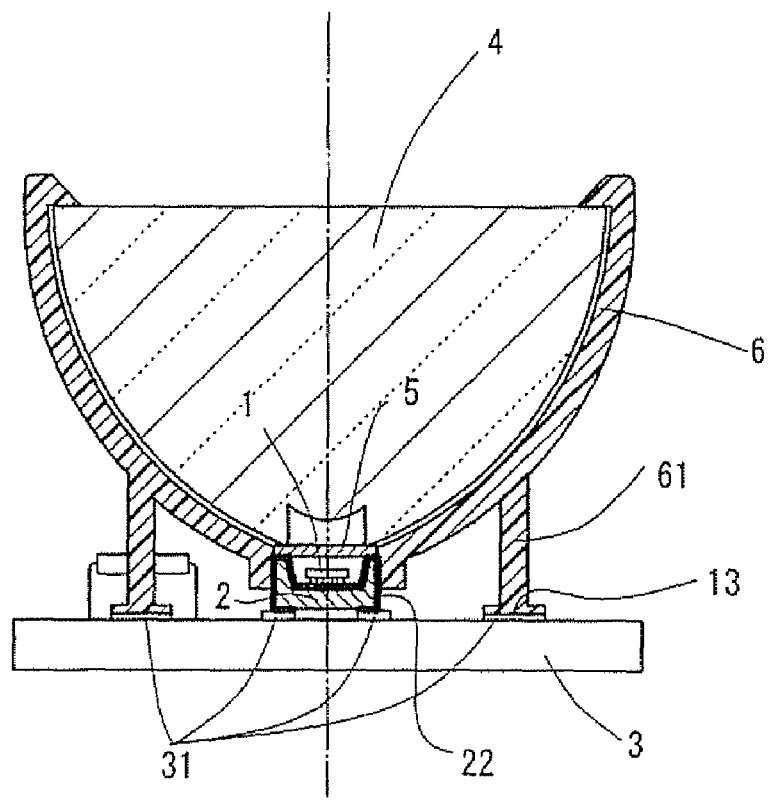
FIG. 16 is a cross sectional view of a light emitting device according to an eleventh embodiment of the present invention.

FIG. 16 shows a light emitting device according to an eleventh embodiment. In this eleventh embodiment, a guide portion 61 for fixing of a lens holder 6 to a wiring board 3 is formed to protrude from the periphery of the lens holder 6 toward the wiring board. The under surface of the guide portion 61 is coated with gold plating 13. The wiring board 3 has a land 31 of gold plating, which is of the same shape as the under surface of the guide portion, at the area on the wiring board where die lens holder is fixed. The lens holder 6 is soldered to the wiring board 3. A mounting substrate 2 is also mounted by soldering a lead electrode 22 provided on the package to a land 31 that is formed on the wiring board 3 and has substantially the same shape as the electrode 22.

In this eleventh embodiment, since a pattern on the wiring board 3 can be generally formed with position accuracy of ±0.1 mm, the mounting substrate 2 and the lens holder 6 mounted via the lands 31 formed through a similar process can be also positioned and fixed with the above high accuracy. Further, since the lens holder 6 and the package 2 can be mounted at a time by reflow soldering, the manufacturing cost can be reduced. Moreover, since the lens 4 and the mounting substrate 2 are positioned and fixed via the wiring board 3, load on the mounting substrate 2 can be prevented. Accordingly, the joint portion of the mounting substrate 2 can be more reliable. Further, the accuracy of positioning between the mounting substrate 2 and the lens holder 6 can be further improved.

Figure 17:
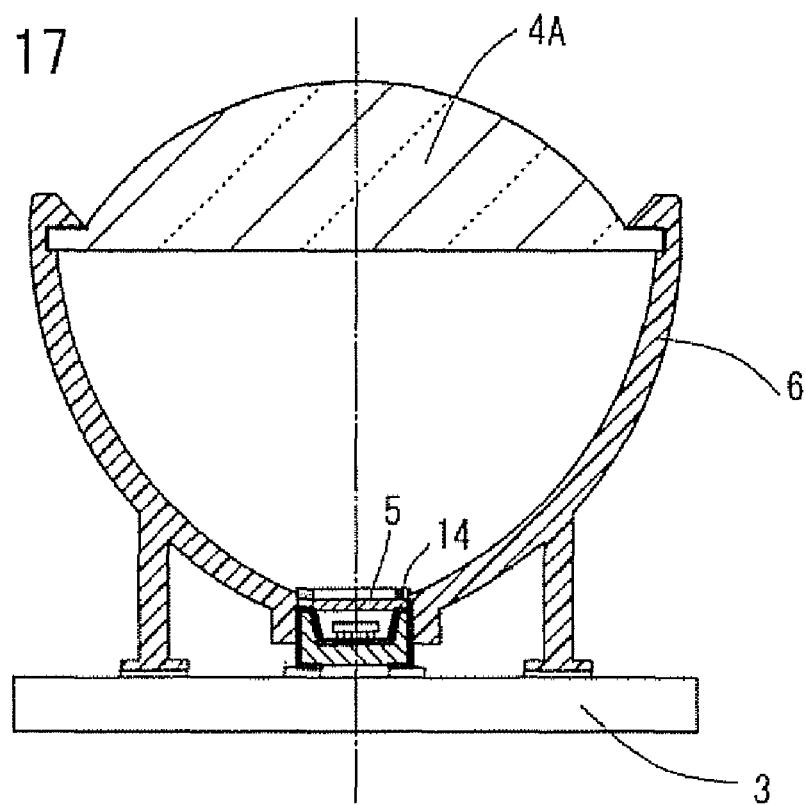
FIG. 17 is a cross sectional view of a light emitting device that is a modified example of the same.

FIG. 17 shows a modified example of the eleventh embodiment. In this example, a convex lens 4A is used in place of the above hybrid lens 4. This example has an effect equivalent to that of the example shown in FIG. 7.

Twelfth Embodiment

Figure 18:
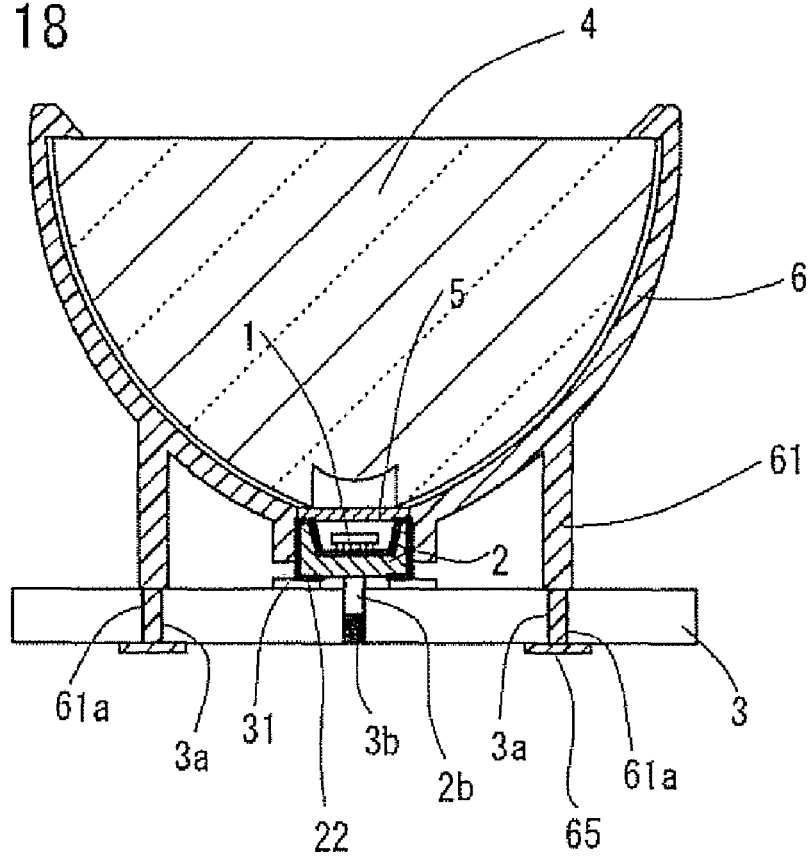
FIG. 18 is a cross sectional view of a light emitting device according to a twelfth embodiment of the present invention.

FIG. 18 shows a light emitting device according to a twelfth embodiment. This twelfth embodiment uses a lens holder 6 made of a resin such as acrylic polycarbonate, ABS, or the like. A guide portion 61 for fixing the lens holder 6 has a protrusion 61a at the end. The protrusion 61a has a diameter smaller than that of the upper part of the guide portion and has sufficient length to pass through a wiring board 3. A mounting substrate 2 has a cylindrical protrusion 2b at the center of the bottom face. The wiring board 3 has through holes 3a and 3b formed by the same process at the portions thereof where the guide portion 61 for fixing the lens holder 6 and the protrusion 2b at the bottom of the mounting substrate 2 are positioned so that the guide portion 61 and the protrusion 2b can be inserted into the through holes. The mounting substrate 2 is positioned by inserting the bottom protrusion 2b into the through hole 3b formed in the wiring board 3. An electrode 22 at the package is soldered to a land 31 on the wiring board. The lens holder 6 is fixed to the wiring board 3 by inserting the thin protrusion 61a of the guide portion 61 into the through holes 3a formed in the wiring board 3 and then thermally welding (65) the portion of the protrusion that protrudes at the back side of the board.

In this twelfth embodiment, the accuracy of a through hole formed in the wiring board 3 by a machine (machine tool) of the same kind is very high, ±0.1 mm. Since the mounting substrate 2 and the lens holder 6 are fixed to the wiring board 3 via the through holes 3b and 3a formed by the same means, the mounting substrate 2 and the lens holder 6 are positioned with respect to each other with an extremely high accuracy. Accordingly, the mounting substrate 2 and the hybrid lens 4 are also positioned and fixed with an extremely high accuracy. Instead of the through holes 3a and 3b, grooves can be formed to receive the protrusions 61a and 2b. Such a configuration can also achieve an effect similar to the above. In this case, the lens holder 6 is fixed with an adhesive.

In this twelfth embodiment, since the lens 4 and the mounting substrate 2 are positioned and fixed via the wiring board 3 load on the mounting substrate 2 can be prevented. Accordingly the joint portion of the mounting substrate 2 can be more reliable. Moreover, the accuracy of positioning between the mounting substrate 2 and the lens holder 6 can be further improved.

Figure 19:
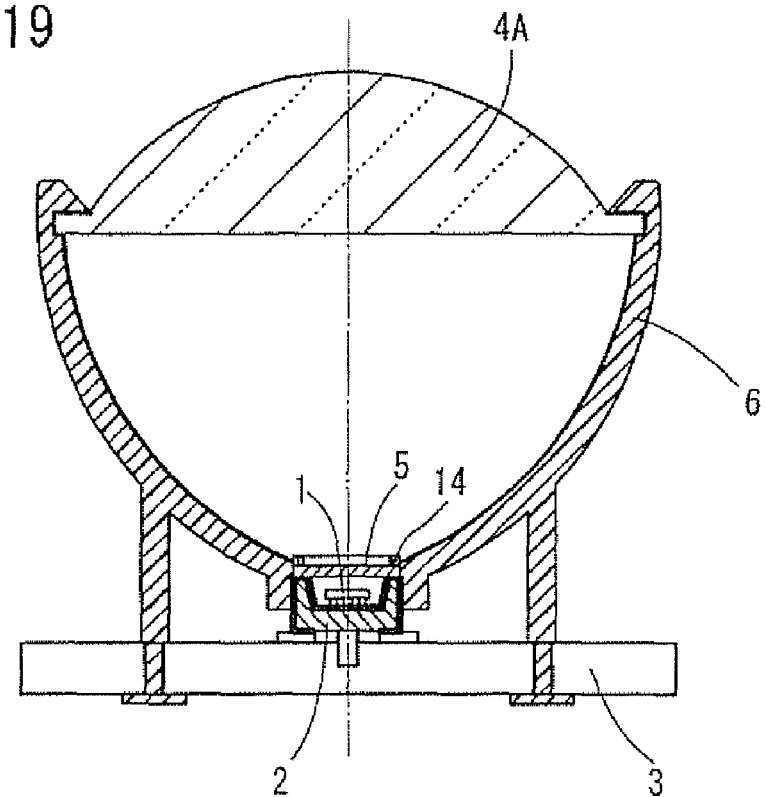
FIG. 19 is a cross sectional view of a light emitting device that is a modified example of the same.

FIG. 19 shows a modified example of the twelfth embodiment. In this example, a convex lens 4A is used in place of the above hybrid lens 4. This example has an effect equivalent to that of the example shown in FIG. 7.

Thirteenth Embodiment

Figure 20:
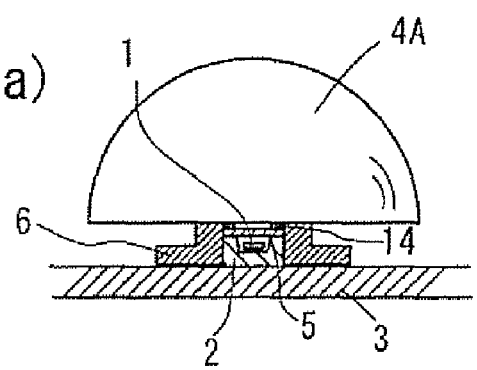
FIG. 20(a) is a side view of a light emitting device according to a thirteenth embodiment of the present invention.
FIG. 20(b) is a plan view of the same.
Figure 20:
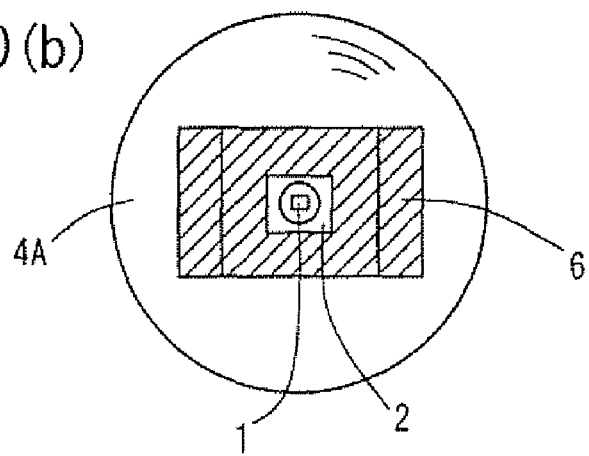

FIGS. 20(a) and 20(b) show a light emitting device according to a thirteenth embodiment. This thirteenth embodiment uses a convex lens 4A, not a hybrid lens. The convex lens 4A is held by a lens holder 6 smaller in diameter than the lens. This configuration also achieves an effect equivalent to that described above. It is to be noted that the present invention is not limited to the above disclosed embodiments, but various modifications are possible.

Fourteenth Embodiment

Figure 21:
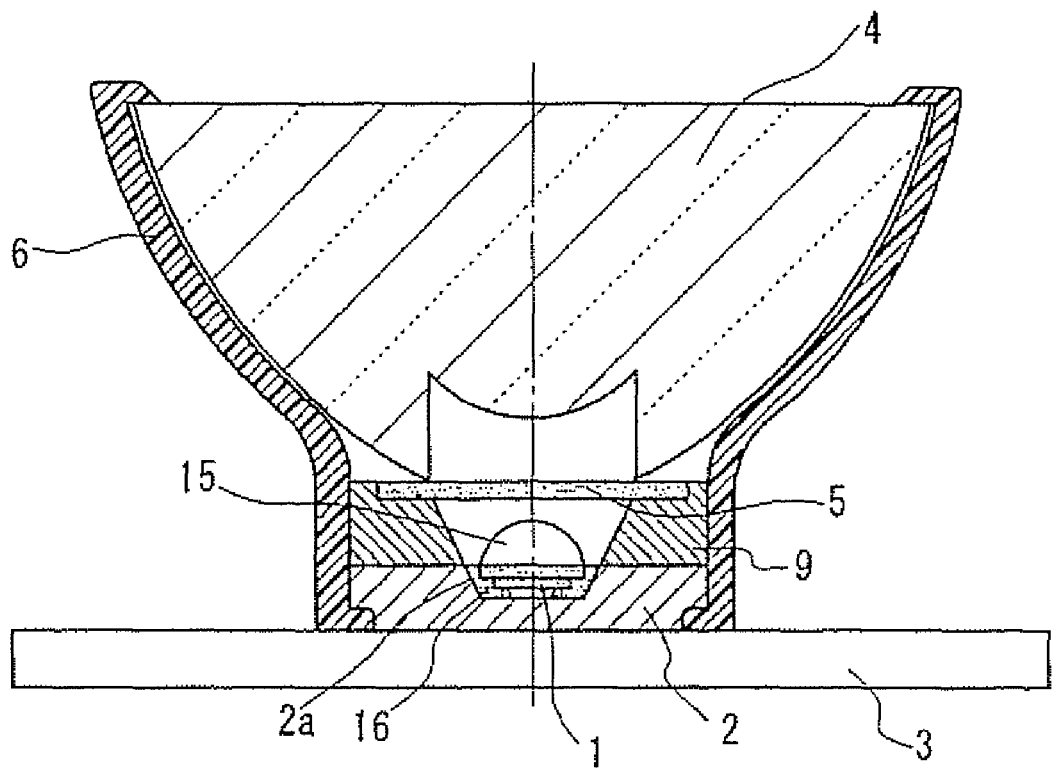
FIG. 21 is a cross sectional view of a light emitting device according to a fourteenth embodiment of the present invention.

FIG. 21 shows a light emitting device according to a fourteenth embodiment. This light emitting device comprises a mounting substrate 2 on which an LED chip 1 is mounted. The mounting substrate 2 is mounted on a wiring board 3. The mounting substrate 2 has a recess 2a, in which a bump 17 of gold for example is formed at wiring (not shown) on the bottom. The LED chip 1 is flip-chip mounted on the bump 17 for electrical connection. Provided at the light output side of the LED chip 1 is a light extraction increasing portion 15 to increase the light extraction efficiency. The light extraction increasing portion 15 is dome-shaped and made of silicone resin. The recess 2a is filled with a sealing resin 16 such as silicone resin or the like so that part of the light extraction increasing portion 15 is encapsulated. The upper end (top of the wall) of the recess 2a is located higher than the light output surface of the LED chip 1 and lower than the top of the light extraction increasing portion 15. The light extraction increasing portion 15 is used to provide the LED chip 1 with a light output surface that is not flat in order to improve the efficiency of extraction of light from the LED chip 1.

Provided on the mounting substrate 2 is a reflecting frame member 9 to surround the light extraction increasing potion 15. The frame member 9 has an opening such that the sloping surface of the recess 2a is extended. A wavelength converting member 5 is mounted on the upper surface of the frame member 9. Like the first embodiment for example, the wavelength converting member 5 has a hybrid lens 4 as an emission control member on the upper side thereof. The hybrid lens 4 is held by a lens holder 6.

Before the reflecting frame member 9 is attached to the mounting substrate 2, the recess 2a is filled with the sealing resin 16. In the process, since redundant resin flows out of the recess 2a, the sealing resin 16 is set so as to be substantially as high as the top of the wall of the recess 2a. Accordingly, the sealing resin 16 does not vary in height, so that it can always encapsulate the light extraction increasing portion 15 up to a certain height. As a result, the effect of light extraction by the light extraction increasing portion 15 can be made uniform, whereby variations in light output can be reduced between light emitting devices.

The material used for the mounting substrate 2 can be ceramics, a printed board, a metal board, or the like. The light extraction increasing portion 15 is not necessarily made of silicone resin, but can be made of glass or a transparent resin such as acrylic resin to achieve a similar effect. The shape of the light extraction increasing portion 15 is not limited to the dome shape. Instead, a structure to reduce the total reflection at the interface between the light extraction increasing portion 15 and an outer medium can be used. The sealing resin 16 that fills the recess 2a is not limited to the silicone but can be a transparent adhesive with a high refractive index.

Fifteenth Embodiment

Figure 22:
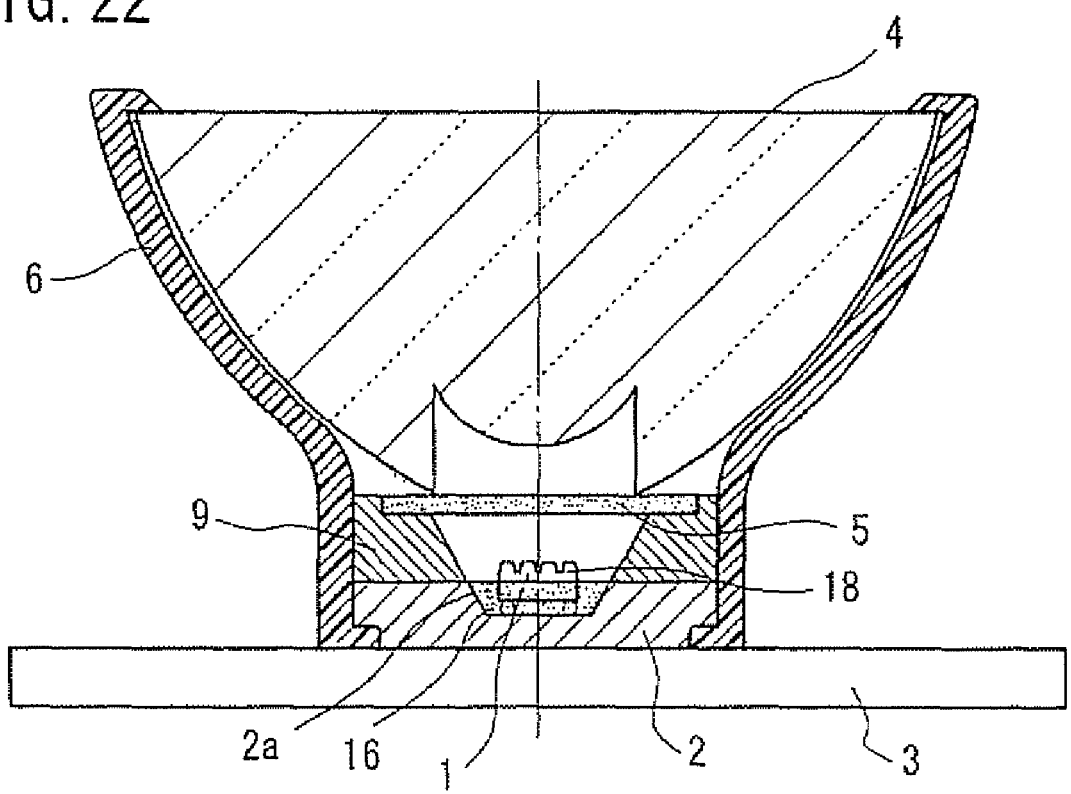
FIG. 22 is a cross sectional view of a light emitting device according to a fifteenth embodiment of the present invention.

FIG. 22 shows a light emitting device according to a fifteenth embodiment. In this light emitting device, the light output side of an LED chip 1 and a light extraction increasing portion 18 are different from those in the above fourteenth embodiment. The light output side of the LED chip has a tapered structure to reduce the total reflection due to the difference in refractive index between the light output side of the chip and the outside. The tapered structure serves as the light extraction increasing portion 18. The other components are configured similar to the above. A sealing resin 16 filling the recess 2a does not vary in height, so that it can always encapsulate the LED chip 1 up to a certain height. Further, the upper end of the recess 2a is located lower than the light extraction increasing portion 18 that is the light output side of the LED chip 1. Accordingly, the light extraction increasing portion 18 can provide a light extraction effect equivalent to that in the above embodiment.

The light extraction increasing portion 18 formed at the light output side of the LED chip 1 does not necessarily have the tapered structure, but can have another structure to reduce the total reflection at the light output surface of the LED chip 1.

Sixteenth Embodiment

Figure 23A:
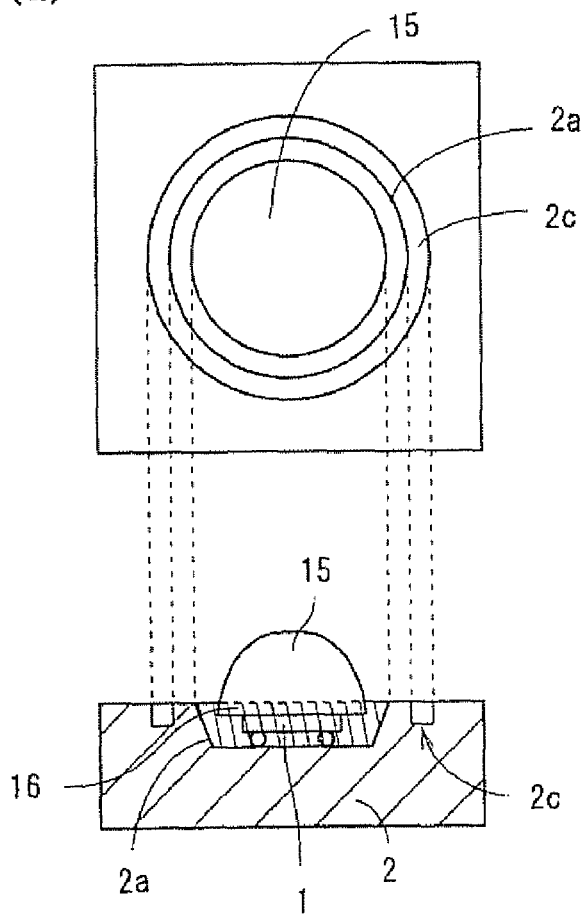
FIG. 23(a) is a top view and a cross sectional view of an LED chip portion in a sixteenth embodiment of the present invention.
Figure 23B:
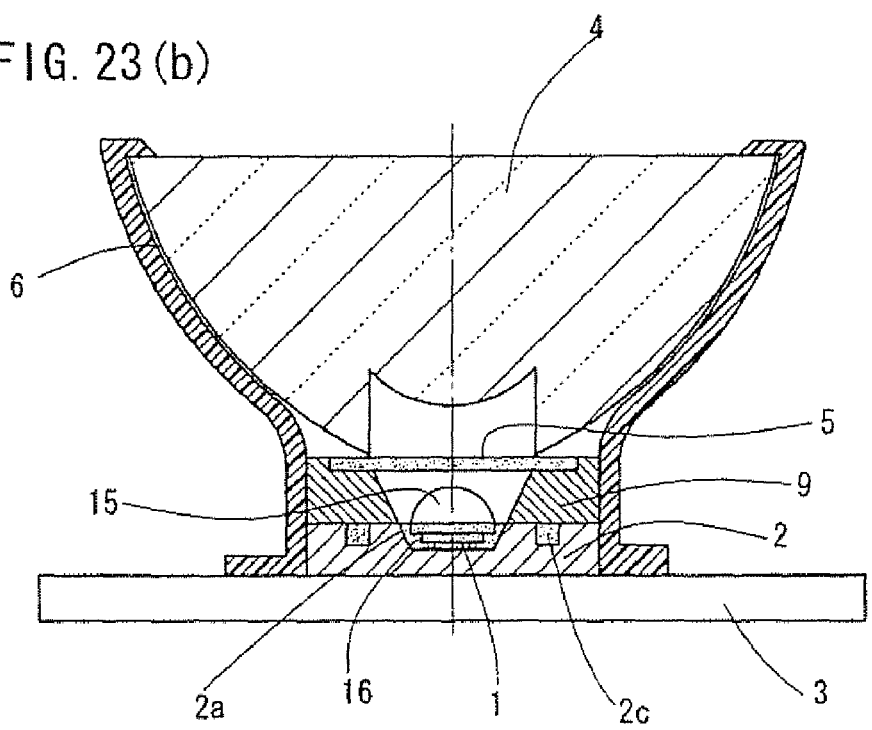
FIG. 23(b) is a cross sectional view of the light emitting device according to the same embodiment.
Figure 24:
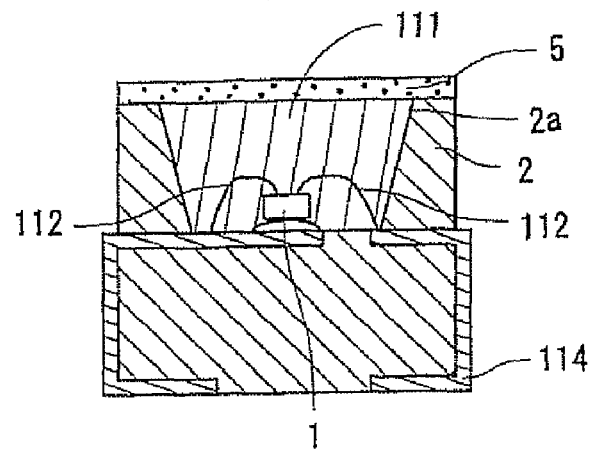
FIG. 24 is a schematic cross sectional view of a conventional light emitting device.
Figure 25:
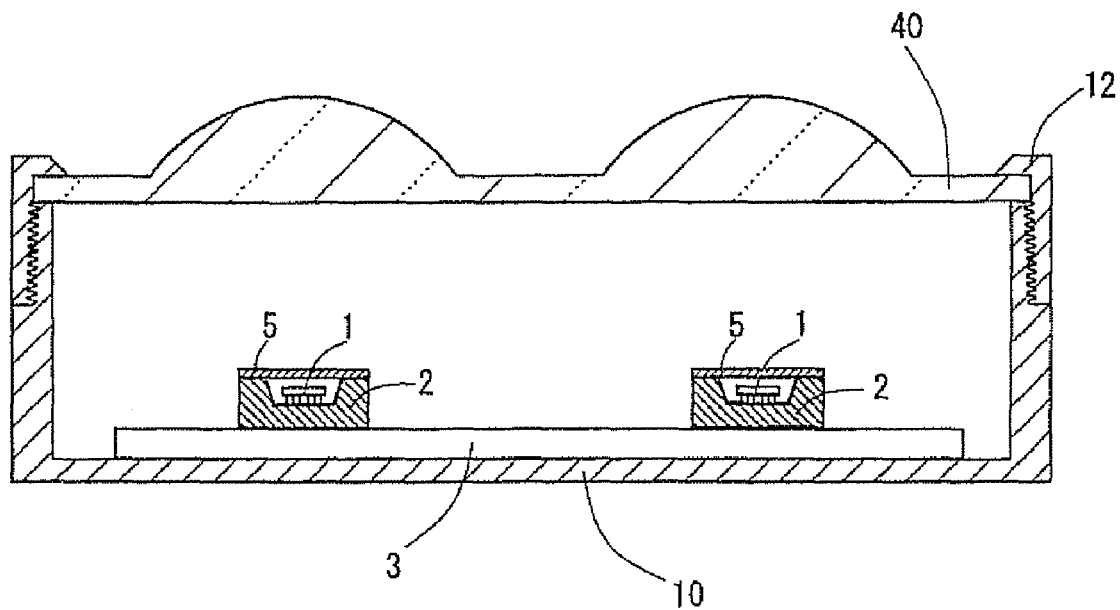
FIG. 25 is a cross sectional view of another conventional light emitting device.
Figure 26A:
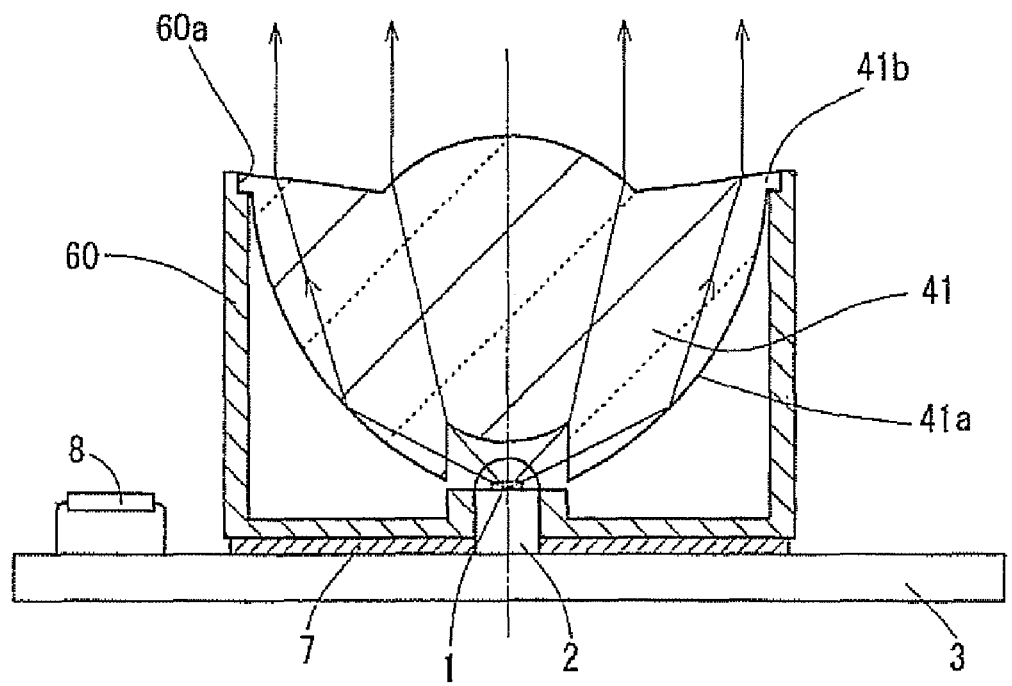
FIG. 26(a) is a cross sectional view of a further conventional light emitting device.
Figure 26B:
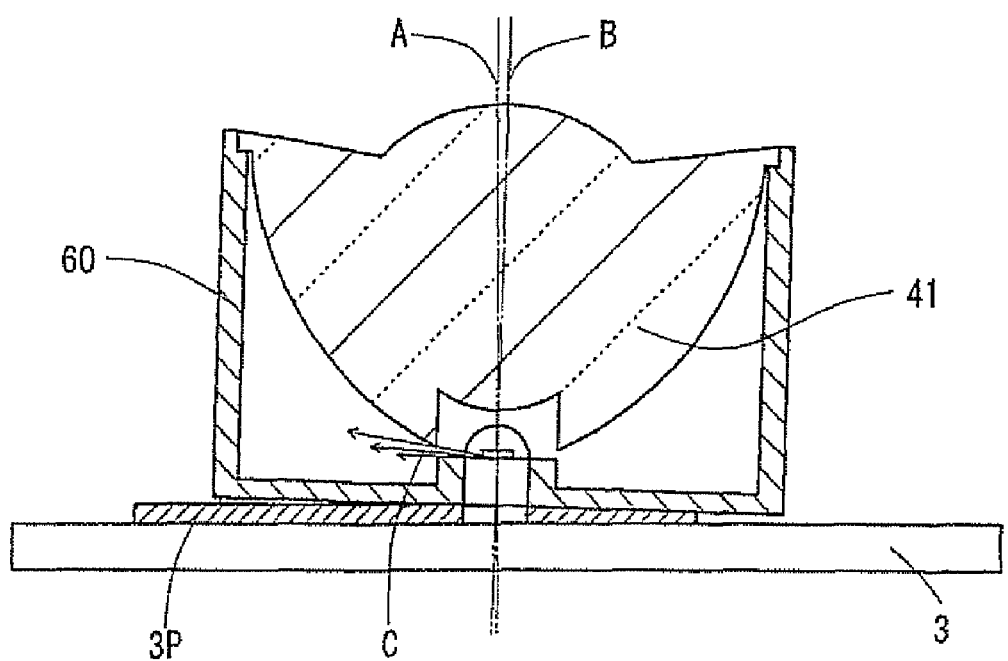
FIG. 26(b) is a cross sectional view showing a condition where a lens holder is fixed in the device.
Figure 27:
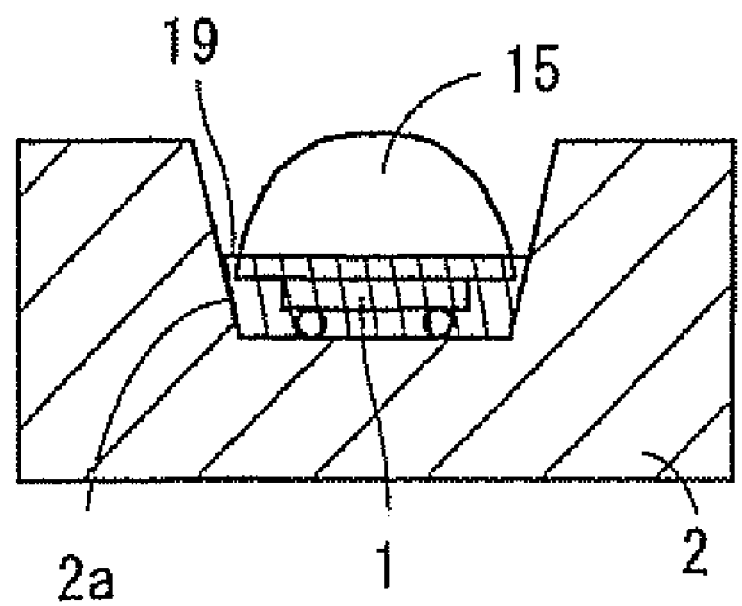
FIG. 27 is a cross sectional view of a still further conventional light emitting device.

FIGS. 23(a) and 23(b) show a light emitting device according to a sixteenth embodiment. This light emitting device is different from the above embodiments in that a mounting substrate 2 has a second recess 2c formed around a recess 2a. When filling the recess 2a with a sealing resin 16, this device allows redundant resin to flow into the surrounding second recess 2c, thereby preventing spillage of the resin to the outside of the mounting substrate 2. Accordingly, components, electric wiring, and so on that are located outside the mounting substrate 2 can be protected from being contaminated by the filling resin. The other components are configured similar to those in the above embodiments. The sealing resin 16 filling the recess 2a does not vary in height, so that it always encapsulates a light extraction increasing portion 15 up to a certain height. Accordingly, the light extraction effect can be made uniform, whereby variations in light output can be reduced between light emitting devices.

The present invention is not limited to the above disclosed embodiments, but various modifications are possible. For example, any structure can be used as long as it allows the upper end of the recess formed in a mounting substrate to be located lower than the top of a light extraction increasing portion, and it allows the height of a sealing resin to be controlled by the mounting substrate so that the sealing resin is as high as the upper end of the recess formed in the mounting substrate.

This application claims priority based on two patent applications flied Nov. 25, 2003 and a patent application filed Nov. 28, 2003. The entire contents of such applications are incorporated into this application by reference.

The invention claimed is:

1. A light emitting device using an LED chip, comprising:
a mounting substrate having a recess and having a wiring portion that supplies electric power to the LED chip, the LED chip being mounted on a bottom of the recess;
a sheet-like wavelength converter disposed so as to cover the recess and an edge area around the recess and that is excited by light emitted from the LED chip to emit light of a wavelength different from an excitation wavelength; and
an emission controller provided at a light output side of the sheet-like wavelength converter so as to allow emission of light coming from an area of the sheet-like wavelength converter that corresponds to the recess and to prevent emission of light coming from an area of the sheet-like wavelength converter that corresponds to the edge area around the recess.

2. The light emitting device according to claim 1, wherein the emission controller comprises an optical member disposed at a light output side of the sheet-like wavelength converter and having a light input portion facing the light output side of the sheet-like wavelength converter, the light input portion of the optical member having a recessed space such that an opening of the light input portion has substantially a same shape as an opening of the recess in the mounting substrate.

3. The light emitting device according to claim 1, wherein the emission controller comprises a light blocking frame member disposed on a light output side of the sheet-like wavelength converter at a location corresponding to the edge area around the recess, the light blocking frame member having an opening of substantially a same shape as the opening of the recess.

4. The light emitting device according to claim 3, wherein the sheet-like wavelength converter comprises a material with a high elasticity, an outer edge area of the wavelength converter being compressed by the light blocking frame member pressed against the sheet-like wavelength converter.

5. The light emitting device according to claim 1, wherein the light output side of the sheet-like wavelength converter is convex.

6. The light emitting device according to claim 1, wherein a density of a wavelength converting material in the sheet-like wavelength converter increases toward a center of the sheet-like wavelength converter.

7. The light emitting device according to claim 1, wherein the emission controller comprises a lens disposed over the mounting substrate to have an optical axis coinciding with an optical axis of the LED chip, and wherein the light emitting device further comprises:

a wiring board having a wiring portion fixed to the mounting substrate to supply electric power to the LED chip; and a lens holder that positions and fixes the lens on the wiring board, wherein a portion of the lens holder fixed to the wiring board is located inside as compared with an outer diameter of the lens.

8. The light emitting device according to claim 7, wherein the lens holder is tapered toward the mounting substrate.

9. The light emitting device according to claim 7, wherein the lens comprises a hybrid lens.

10. The light emitting device according to claim 7, wherein one of a top face and a side face of the mounting substrate is fitted to the lens holder.

11. The light emitting device according to claim 7, wherein the lens holder is engaged in one of grooves and through holes formed in the wiring board.

12. The light emitting device according to claim 11, wherein the mounting substrate and the lens are positioned and fixed on the wiring board via a same fixer.

13. The light emitting device according to claim 12, further comprising:

a metal foil for soldering that is provided on an under surface of a fixed portion of the lens holder;

a land that has substantially a same shape as the fixed portion of the lens holder and that is formed on the wiring board;

a lead electrode provided on the mounting substrate to be connected to the wiring portion of the wiring board; and a wiring land that has substantially a same shape as the lead electrode and that is formed on the wiring portion of the wiring board, wherein the metal foil and the land, and the lead electrode and the wiring land are connected to each other by soldering, respectively.

14. The light emitting device according to claim 12, wherein a protrusion formed on the under surface of the lens holder is engaged in one of a through hole and a groove formed in the wiring board, and wherein a protrusion formed on an under surface of the mounting substrate is engaged in one of the through hole and the groove formed in the wiring board.

15. The light emitting device according to claim 1, further comprising:

a light extraction increasing portion provided on a light output side of the LED chip to increase efficiency of extraction of light from the LED chip by being combined with the LED chip; and a sealing resin that fills the recess in the mounting substrate where the LED chip is mounted to seal the recess, wherein a top of the light extraction increasing portion is located higher than a top of a wall of the recess.

16. The light emitting device according to claim 15, wherein the mounting substrate has a second recess around the recess so that the resin can flow into the second recess.

17. A light emitting device using an LED chip, comprising:

a mounting substrate having a recess and having a wiring portion that supplies electric power to the LED chip, the LED chip being mounted on a bottom of the recess;

a wavelength converter disposed so as to cover the recess and an edge area around the recess and that is excited by light emitted from the LED chip to emit light of a wavelength different from an excitation wavelength; and an emission controller provided at a light output side of the wavelength converter so as to allow emission of light coming from an area of the wavelength converter that corresponds to the recess and to prevent emission of light coming from an area of the wavelength converter that corresponds to the edge area around the recess, wherein the wavelength converter has a cross section that is convex at the light output side, such that light paths having different observation angles are substantially equal in length.

18. A light emitting device using an LED chip, comprising:

a mounting substrate having a recess and having a wiring portion that supplies electric power to the LED chip, the LED chip being mounted on a bottom of the recess;

a wavelength converter disposed so as to cover the recess and an edge area around the recess and that is excited by light emitted from the LED chip to emit light of a wavelength different from an excitation wavelength; and an emission controller provided at a light output side of the wavelength converter so as to allow emission of light coming from an area of the wavelength converter that corresponds to the recess and to prevent emission of light coming from an area of the wavelength converter that corresponds to the edge area around the recess, wherein a density of a wavelength converting material in the wavelength converter increases toward a center of the wavelength converter reducing observation angle variations of color and intensity of light.

* * * * *